(12) United States Patent
Takemae

(10) Patent No.: US 8,977,832 B2
(45) Date of Patent: *Mar. 10, 2015

(54) MEMORY SYSTEM HAVING A PLURALITY OF TYPES OF MEMORY CHIPS AND A MEMORY CONTROLLER FOR CONTROLLING THE MEMORY CHIPS

(71) Applicant: Fujitsu Semiconductor Limited, Yokohama-shi, Kanagawa (JP)

(72) Inventor: Yoshihiro Takemae, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/933,983

(22) Filed: Jul. 2, 2013

(65) Prior Publication Data

US 2013/0297890 A1 Nov. 7, 2013

Related U.S. Application Data

(62) Division of application No. 11/505,835, filed on Aug. 18, 2006, which is a division of application No. 10/687,591, filed on Oct. 20, 2003, now Pat. No. 7,165,159, which is a division of application No. 10/057,989, filed on Jan. 29, 2002, now Pat. No. 6,650,593.

(30) Foreign Application Priority Data

Feb. 27, 2001 (JP) .................................. 2001-052484

(51) Int. Cl.
G06F 12/00 (2006.01)
G06F 13/00 (2006.01)
(Continued)

(52) U.S. Cl.
CPC ........ *G06F 12/0246* (2013.01); *G06F 13/1694* (2013.01); *G11C 5/04* (2013.01); *G06F 12/00* (2013.01); *G06F 12/0623* (2013.01)
USPC ........... 711/167; 711/101; 711/168; 711/103; 711/115

(58) Field of Classification Search
None
See application file for complete search history.

(56) References Cited

U.S. PATENT DOCUMENTS 4,713,756 A * 12/1987 Mackiewicz et al. ......... 365/228
4,999,620 A 3/1991 Ishii
(Continued)

FOREIGN PATENT DOCUMENTS

JP 02-143347 A 6/1990
JP 4-326140 A 11/1992
(Continued)

OTHER PUBLICATIONS

Non-Final Office Action, U.S. Appl. No. 13/933,947 dated Oct. 30, 2013.
(Continued)

*Primary Examiner* — Yaima Rigol
(74) *Attorney, Agent, or Firm* — Arent Fox LLP

(57) ABSTRACT

A memory controller converts controller output signals output from a controller into memory input signals according to the operation specifications of memory chips to operate, and outputs the resultant to the memory chips through a common bus. The memory controller also receives memory output signals output from the memory chips through the common bus, and converts the received signals into controller input signals receivable to the controller. This allows the single memory controller to access the plurality of types of memory chips. As a result, the memory controller can be reduced in chip size, lowering the cost of the memory system.

84 Claims, 17 Drawing Sheets

(51) Int. Cl.
*G06F 13/28* (2006.01)
*G06F 12/02* (2006.01)
*G06F 13/16* (2006.01)
*G11C 5/04* (2006.01)
*G06F 12/06* (2006.01)

(56) References Cited

U.S. PATENT DOCUMENTS

| | | | |
|---|---|---|---|
| 5,200,600 A * | 4/1993 | Shinagawa | 235/492 |
| 5,563,812 A * | 10/1996 | Shou et al. | 708/7 |
| 5,777,925 A | 7/1998 | Tokushige | |
| 5,794,072 A | 8/1998 | Nomura et al. | |
| 5,804,987 A | 9/1998 | Ogawa et al. | |
| 5,983,331 A | 11/1999 | Akamatsu et al. | |
| 6,047,361 A * | 4/2000 | Ingenio et al. | 711/167 |
| 6,085,317 A | 7/2000 | Smith | |
| 6,415,348 B1 | 7/2002 | Miergard et al. | |
| 6,456,517 B2 | 9/2002 | Kim et al. | |
| 6,470,433 B1 | 10/2002 | Prouty et al. | |
| 6,480,947 B1 | 11/2002 | Hasegawa et al. | |
| 6,721,840 B1 | 4/2004 | Allegrucci | |
| 6,834,322 B2 | 12/2004 | Sukegawa | |
| 7,386,659 B2 | 6/2008 | Takemae | |
| 2001/0011311 A1 | 8/2001 | Takeda | |
| 2001/0054135 A1 | 12/2001 | Matsuda | |
| 2002/0138686 A1* | 9/2002 | Yang et al. | 711/105 |
| 2002/0159284 A1 | 10/2002 | Funaba et al. | |
| 2003/0070049 A1 | 4/2003 | Suzuki | |
| 2010/0146171 A1 | 6/2010 | Takemae | |
| 2010/0146196 A1 | 6/2010 | Takemae | |

FOREIGN PATENT DOCUMENTS

| | | |
|---|---|---|
| JP | 6-4398 A | 1/1994 |
| JP | 6-42263 B2 | 6/1994 |
| JP | 8-320823 A | 12/1996 |
| JP | 2001-14218 A | 1/2001 |

OTHER PUBLICATIONS

Non-Final Office Action, U.S. Appl. No. 13/933,959 dated Nov. 14, 2013.

"Semiconductor Memories," Betty Prince, 1983, Wiley, 2nd edition, pp. 64-66.

Castille, TMS320C6000 EMIF to External SBSRAM Interface, Digital Signal Processing Solutions, Texas Instruments, Application Report SPRA533, Apr. 1999, pp. 1-26.

Castille, TMS320C6000 EMIF to External SDRAM/SGRAM Interface, Digital Signal Processing Solutions, Texas Instruments, Application Report SPRA433A, Jun. 1999, pp. 1-55.

TMS320C6000 Peripherals Reference Guide, Texas Instruments, Literature Number: SPRU190C, Apr. 1999, pp. 1-82.

TMS320C6201, TMS320C6201B Digital Signal Processors, Texas Instruments, SPRS051F, Jan. 1997, Revised Aug. 1999, pp. 1-75.

TMS320C6205 Fixed-Point Digital Signal Processor, Texas Instruments, SPRS106, Oct. 1999, pp. 1-59.

TMS32OC62xx Peripherals Reference Guide, Digital Signal Processing Solutions, Texas Instruments, Literature Number: SPRU190A, Oct. 1997, pp. 1-50.

* cited by examiner

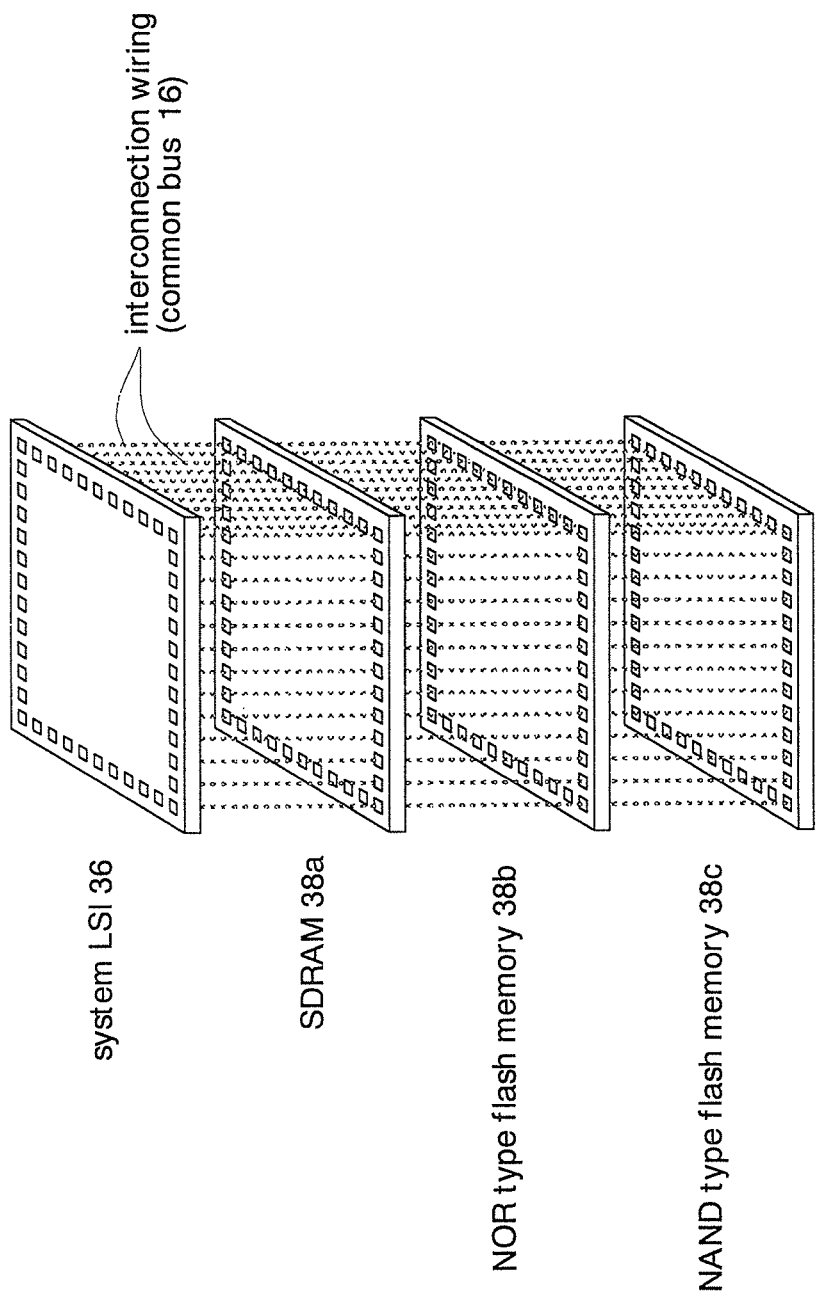

MEMORY SYSTEM HAVING A PLURALITY OF TYPES OF MEMORY CHIPS AND A MEMORY CONTROLLER FOR CONTROLLING THE MEMORY CHIPS

CROSS-REFERENCE TO RELATED APPLICATION

This is a Divisional Application of U.S. patent application Ser. No. 11/505,835, filed Aug. 18, 2006; which in turn is a Divisional Application of U.S. patent application Ser. No. 10/687,591, filed Oct. 20, 2003, now U.S. Pat. No. 7,165,159, Issued Jan. 16, 2007, which in turn is a Divisional Application of U.S. patent application Ser. No. 10/057,989, filed Jan. 29, 2002, now U.S. Pat. No. 6,650,593, Issued Nov. 18, 2003, which claims priority to Japanese Patent Application No. 2001-052484, filed Feb. 27, 2001. The disclosures of each of the prior applications are hereby incorporated in their entirety by reference.

BACKGROUND OF THE INVENTION

1. Field of the Invention

The present invention relates to a memory system having a plurality of types of memory chips and a memory controller for controlling these memory chips.

2. Description of the Related Art

With the progression of semiconductor manufacturing technology and semiconductor design technology, it has become possible to implement one whole system on a single semiconductor chip. A semiconductor that operates as a single system is generally referred to as a system LSI. A system LSI contains, for example, an MPU core for controlling the entire system, peripheral cores (IP cores) having a predetermined function, and a memory core. The memory core stores programs necessary for the operation of the system, data for the system to handle, and so on.

Recently, there have been developed portable apparatuses that handle large amounts of data such as moving images. When these portable apparatuses use memory capacities beyond those of the memory cores mounted on their system LSIs, it is usual to constitute the systems with semiconductor memories (memory chips) externally attached to the system LSIs. The reason for this is that if high capacity memory cores are incorporated into the system LSIs, the system LSIs increase in chip size and might drop in yield.

Furthermore, logic products such as an MPU and memory products such as a DRAM are optimized in design for respective features, and manufactured under respective optimum conditions. Accordingly, designing and manufacturing the memory chips aside from the system LSIs (logic chips) can improve system performance.

FIG. 1 shows an example of the system (memory system) in which a plurality of types of memory chips are externally attached to a system LSI. Here, a memory system refers to a set of functions of a system constituting the above-mentioned portable apparatus or the like that are necessary for memory operation.

The memory system comprises a system LSI 2 and a plurality of types of memory chips 3a, 3b, and 3c to be mounted on a printed-circuit board 1. The system LSI 2 has an MPU 4 for controlling the entire system, peripheral cores (IP) 5a and 5b having a predetermined function, and memory controllers 6a, 6b, and 6c corresponding to the memory chips 3a, 3b, and 3c, respectively. The memory chips 3a, 3b, and 3c are respectively connected to the memory controllers 6a, 6b, and 6c through buses 7a, 7b, and 7c which are laid on the printed-circuit board 1.

Conventionally, in the case of constructing the memory system from the system LSI 2 and the plurality of types of memory chips 3a, 3b, and 3c, it has been required, as described above, that the memory chips 3a, 3b, and 3c be individually provided with the memory controllers 6a, 6b, and 6c. For example, SDRAMs and flash memories have different command systems and operation timing for performing write operations and read operations. Therefore, SDRAMs and flash memories have necessitated their respective memory controllers when externally attached to a system LSI. As a result, there has been a problem that the system LSI 2 grows in chip size and increases in chip cost.

Since the terminals of the memory chips 3a, 3b, and 3c are connected to the terminals of the system LSI 2 through the buses 7a, 7b, and 7c, respectively, the number of terminals of the system LSI 2 becomes enormous. Consequently, the system LSI 2 might be greater in chip size depending on the number of terminals. In worst cases, it has been necessary to develop a new package for the number of terminals of the system LSI 2.

Since the plurality of memory controllers 6a, 6b, and 6c are mounted on the system LSI 2, the system LSI 2 has been greater in circuit scale, requiring an enormous amount of time for design verification.

The formation of the buses 7a, 7b, and 7c necessitates large numbers of wires on the printed-circuit board 1. Consequently, there has been a problem that the wiring layers of the printed-circuit board 1 grows in number, increasing the design cost and manufacturing cost of the printed-circuit board 1.

Clock synchronous SDRAMs have been developed to improve the data transmission rates of DRAMs. For other clock asynchronous semiconductor memories (including nonvolatile memories), products of clock synchronous type are also likely to be developed.

SUMMARY OF THE INVENTION

It is an object of the present invention to reduce the costs of a memory system that has a plurality of types of memory chips and a memory controller for controlling these memory chips.

Another object of the present invention is to provide a common interface in a memory system comprising a system LSI with a plurality of types of memory chips externally attached, the common interface connecting the memory chips and the system LSI for controlling the memory chips.

Still another object of the present invention is to attach clock synchronous nonvolatile memories externally to a system LSI with facility and lower costs.

According to one of the aspects of the memory system of the present invention, the memory system comprises: a plurality of types of memory chips operating in synchronization with a clock signal; a controller for issuing access requests to the memory chips; a memory controller for controlling the memory chips; and a common bus for connecting the memory chips and the memory controller to transmit memory input signals and memory output signals. The memory chips include, for example, a volatile memory such as a synchronous DRAM and a nonvolatile memory such as a clock synchronous NAND type flash memory.

The memory controller converts, according to operation specifications of the memory chips to operate, controller output signals which the controller outputs to the memory controller when operating memory chips, into the memory input signals receivable to the memory chips. The memory chips receive the memory input signals and perform a read operation, a write operation, or the like. Among the controller output signals and the memory input signals are address signals, command signals, and write data signals.

The memory chips output read data signals obtained through their read operations to the common bus as the memory output signals. The memory controller receives the memory output signals through the common bus, and converts the received signals into read data signals (controller input signals) receivable to the controller. Then, the controller receives the controller input signals, thereby completing the read operations of the memory system.

As described above, the memory controller converts controller output signals into memory input signals receivable to the individual memory chips. This allows the single memory controller to access the plurality of types of memory chips. As a result, the plurality of memory chips can be connected to the memory controller through the common bus, which can minimize a number of signal lines. In addition, the memory controller can be reduced in circuit scale. The memory controller need not be designed anew upon each development of memory chips as heretofore.

According to another aspect of the memory system of the present invention, the memory output signals and the memory input signals received respectively by the memory controller and the memory chips through the common bus have the same input timing specification irrespective of which of the memory chips is to operate. Similarly, the memory input signals and the memory output signals output respectively from the memory controller and the memory chips through the common bus have the same output timing specification irrespective of which of the memory chips is to operate. On this account, the memory controller can reliably access the plurality of types of memory chips having different operation specifications by simply adjusting the output order of the memory input signals and the acceptance order of the memory output signals according to the command specifications and the like of the memory chips.

For example, the input timing specification is defined by a setup time tIS and a hold time tIH with respect to an edge of the clock signal. Similarly, the output timing specification is defined by a setup time tOS and a hold time tOH with respect to an edge of the clock signal. When the setup time tOS and the hold time tOH are set longer than the setup time tIS and the hold time tIH, the memory controller and the individual memory chips can surely receive the memory output signals and the memory input signals, respectively.

According to another aspect of the memory system of the present invention, the memory controller includes an operation memory unit, an input/output controlling unit, and a conversion control unit. The operation memory unit stores the operation specifications of the respective memory chips. The conversion control unit operates the input/output controlling unit in accordance with information from the operation memory unit. For example, the conversion control unit has only to control the operation timing and the input/output direction of the input/output controlling unit in accordance with the information from the operation memory unit. The input/output controlling unit operates under instructions from the conversion control unit, to input the controller output signals from the controller and output the controller input signals to the controller, and to output the memory input signals to the memory chips and input the memory output signals from the memory chips. Operating the input/output controlling unit, or the interface with the memory chips, according to the operation specifications of the respective memory chips makes it possible to operate the memory chips reliably without using complicated control circuits.

According to another aspect of the memory system of the present invention, the memory controller includes a signal holding unit. The signal holding unit temporarily holds the controller output signals and the memory output signals received by the input/output controlling unit. For example, when the memory chip to be accessed is a synchronous DRAM of address multiplex system, an address signal (controller output signal) held in the signal holding unit is divided under the instruction from the conversion control unit and output in succession as a row address signal and a column address signal. Similarly, when the memory chip to be accessed is a clock synchronous NAND type flash memory, a start address (controller output signal) held in the signal holding unit is divided into a plurality of packets under the instruction from the conversion control unit for successive outputs. That is, signals can be output to the memory chips according to the operation specifications of the respective memory chips.

According to another aspect of the memory system of the present invention, if one of the memory chips is in operation when the memory controller receives the controller output signal for operating another of the memory chips, the signal holding unit temporarily holds this controller output signal. That is, the controller output signal output from the controller can be held until the common bus becomes available. Since the controller output signal is held by the signal holding unit of the memory controller, the controller can access other devices such as a peripheral circuit, or peripheral cores, independent of the operation wait for the another memory chip. Since the controller is prevented from executing useless cycles, the entire system improves in operating efficiency.

According to another aspect of the memory system of the present invention, the memory controller includes an arbiter. The arbiter adjusts the order of accesses to the memory chips depending on the operation states of the memory chips and the holding order of the controller output signals corresponding to a plurality of memory chips that are held in the signal holding unit. The arbiter is composed of, for example, programmable logics capable of reconstructing their respective circuit functions.

If a memory chip is using the common bus when the controller issues an access request to another memory chip, the arbiter keeps the access to the another memory chip waiting until the common bus becomes available. The output controller signal output from the controller to access the another memory chip is temporarily held in the signal holding unit.

In some cases where the controller issues access requests to a plurality of memory chips for read operations, one of the memory chips can complete its read operation within the period from the start of the operation of another memory chip to the output of a read data signal. In such cases, the arbiter operates the one memory chip by utilizing the vacancy of the common bus during the operation period of the another.

By dint of the arbiter, the single memory controller can operate the plurality of types of memory chips with efficiency. As a result, the memory system can be improved in data transmission rate.

According to another aspect of the memory system of the present invention, the memory controller and the controller are mounted on an identical chip, being formed into a system LSI, for example. The memory controller itself can handle the plurality of types of memory chips, by which reduces the circuit scale. As a result, the system LSI where the memory controller is mounted can be reduced in chip size, lowering the cost of the memory system. Since the system LSI becomes smaller in circuit scale, it is possible to reduce the time necessary for the design verification of the system LSI.

According to another aspect of the memory system of the present invention, the common bus is formed on a printed-circuit board for mounting the controller and the memory chips. Sharing the memory controller among the plurality of memory chips can reduce the number of signal lines to be laid on the printed-circuit board, lowering the design cost and manufacturing cost of the printed-circuit board.

According to another aspect of the memory system of the present invention, the controller and the memory controller are stacked in three dimensions. The common bus is formed as interconnection wiring for connecting the controller and the memory chips. Sharing the memory controller among the plurality of memory chips can reduce the number of interconnection wires, thereby allowing an improvement in the reliability of the memory system stacked in three dimension.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 17 is a system block diagram showing a third embodiment of the present invention.

DESCRIPTION OF THE PREFERRED EMBODIMENTS

Hereinafter, embodiments of the present invention will be described with reference to the drawings.

Figure 2:
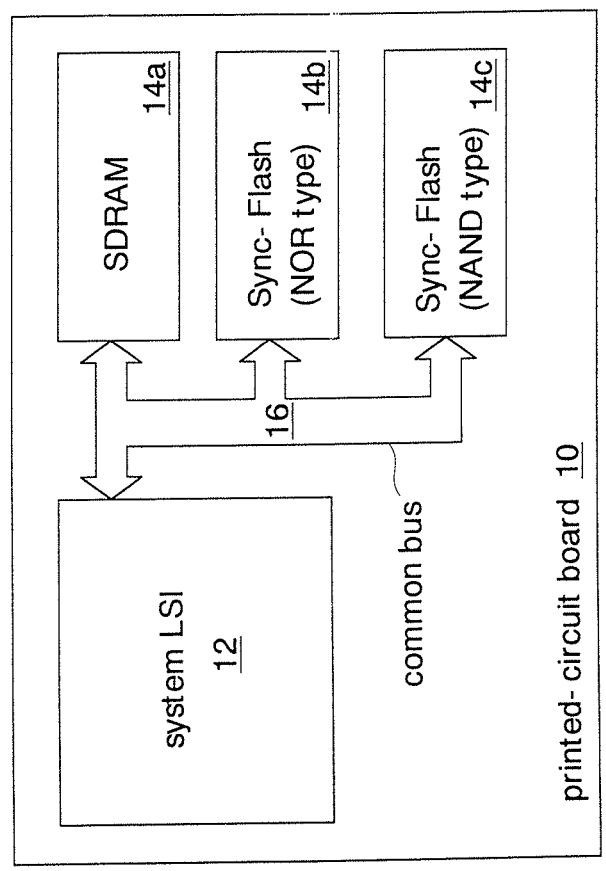
FIG. 2 is a system block diagram showing a first embodiment of the present invention.

FIG. 2 shows a first embodiment of the memory system in the present invention.

The memory system comprises a system LSI 12 and three clock synchronous memory chips 14 (an SDRAM 14a, a NOR type flash memory 14b, and a NAND type flash memory 14c) which are mounted on a printed-circuit board 10. The system LSI 12 and the memory chips 14a, 14b, and 14c are connected to each other through a common bus 16 formed on the printed-circuit board 10 and signal lines to be described later. Incidentally, the printed-circuit board 10 contains other electronic components which are not shown, and operates as a main board of, for example, a portable Internet terminal or the like. That is, the printed-circuit board 10 operates as a portable system having predetermined functions. The memory system is a set of functions of this portable system that are required for memory operation.

Figure 3:
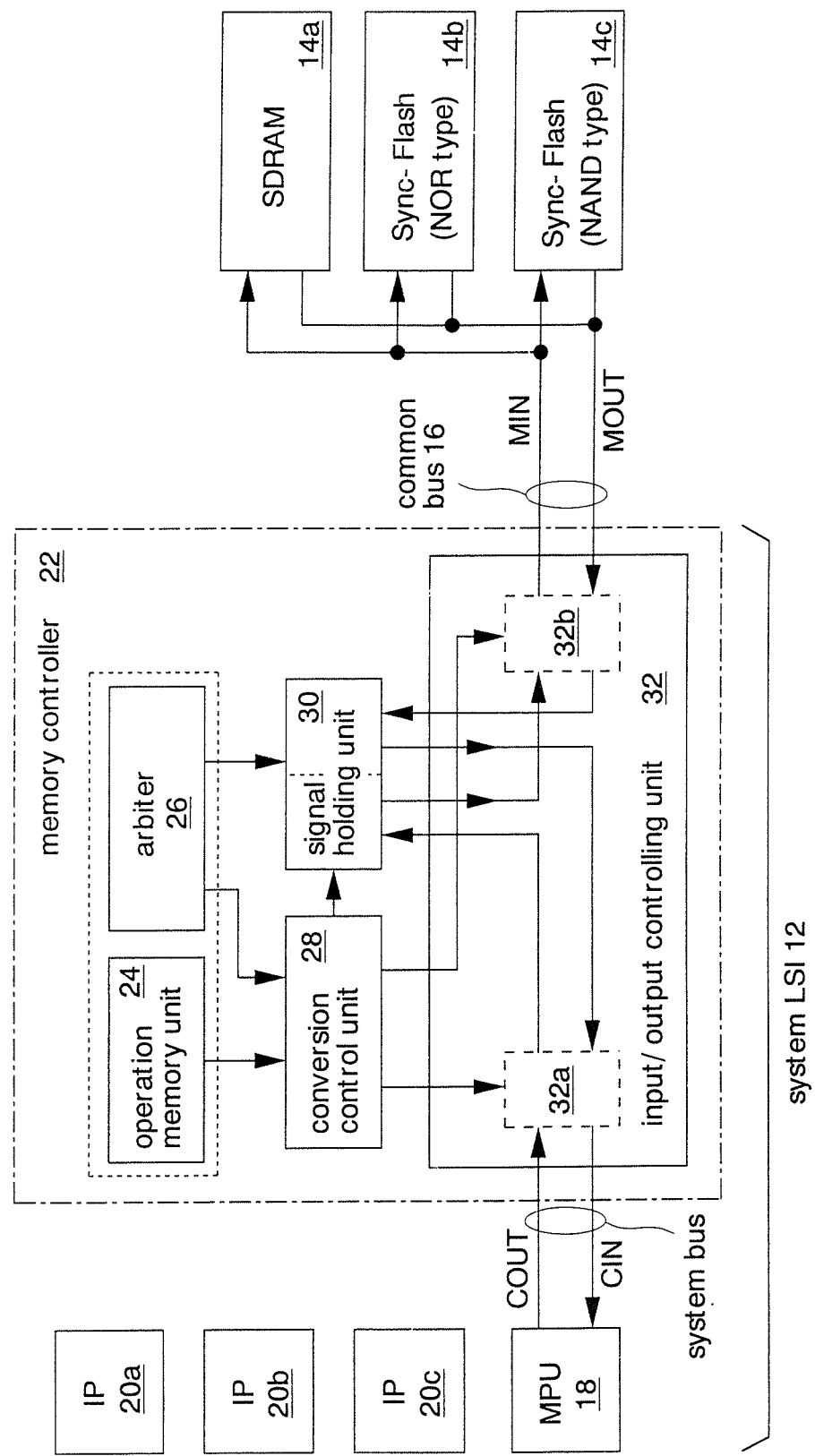
FIG. 3 is a block diagram showing the details of the system LSI of FIG. 2.

FIG. 3 shows the details of the system LSI 12.

The system LSI includes an MPU 18 (controller) for controlling the memory chips 14a, 14b, and 14c, peripheral cores (IP cores) 20a, 20b, and 20c having predetermined functions, and a memory controller 22 which is common to the memory chips 14a, 14b, and 14c. The memory controller 22 includes an operation memory unit 24, an arbiter 26, a conversion control unit 28, a signal holding unit 30, and an input/output controlling unit 32.

The operation memory unit 24 stores the operation specifications of the memory chips 14a, 14b, and 14c. For example, when the MPU 18 accesses the memory chip 14a (SDRAM) for read operation, the operation memory unit 24 outputs to the conversion control unit 28 information such as the order of commands and addresses to be supplied to the SDRAM and the number of clocks (latency) from the supply of a command to the output of data.

The arbiter 26 adjusts the order of accesses to a plurality of memory chips 14 when the accesses to the memory chips 14 overlap. Specifically, when the MPU 18 instructs read of the memory chip 14a (SDRAM) and then instructs, before the completion of the read operation, read of the memory chip 14b (NOR type flash memory), the arbiter 26 instructs the conversion control unit 28 not to execute the processing on the memory chip 14b. At the same time, the arbiter 26 instructs the signal holding unit 30 to hold the signals that are supplied from the MPU 18 regarding the access to the memory chip 14b.

The operation memory unit 24 is composed of programmable logics capable of rewriting information stored in themselves. The arbiter 26 is composed of programmable logics capable of reconstructing their circuits. The information of the operation memory unit 24 and the circuit functions of the arbiter 26 are programmed in accordance with the memory chips 14 to be connected to the common bus 16. Therefore, the memory controller 22 can be used as a general purpose IP core. The elements to constitute the programmable logics may be either volatile or nonvolatile.

The conversion control unit 28 controls the input/output controlling unit 32 and the signal holding unit 30 in accordance with the information from the operation memory unit 24 and the instruction from arbiter 26. For example, when the MPU 18 accesses the memory chip 14a (SDRAM) for read operation, the conversion control unit 28 instructs the signal holding unit 30 to divide the held address signal into a row address signal and a column address signal for output. It also instructs that the command signal for instructing the read operation be divided into an active command and a read command for output. In the meantime, the conversion control unit 28 instructs an input/output controlling circuit 32b on the output timing with which the address signals and the command signals are output from the signal holding unit 30.

Based on the information (read latency) from the operation memory unit 24, the conversion control unit 28 instructs the input/output circuit 32b (to be described later) in the timing with which it accepts a read data signal output from the SDRAM 14a (memory output signal MOUT in the common bus 16). In addition, when the MPU 18 is busy, the conversion control unit 28 instructs the signal holding unit 30 to hold the accepted read data signal temporarily. When the MPU 18 is ready, the read data signal is output through the signal holding unit 30 directly as a controller input signal CIN. Here, the conversion control unit 28 instructs an input/output circuit 32a (to be described later) on the timing with which the read data signal is output as the controller input signal CIN.

The signal holding unit 30, as mentioned above, temporarily holds controller output signals COUT output from the MPU 18 and memory output signals MOUT output from the memory chips 14 under the instructions from the arbiter 26 and the conversion control unit 28. The signal holding unit 30 also outputs the held controller output signals COUT and memory output signals MOUT to the input/output circuits 32b and 32a, respectively.

The input/output controlling unit 32 has the input/output circuit 32a for inputting/outputting signals to/from the MPU 18 (system bus) and the input/output circuit 32b for inputting/outputting signals to/from the memory chips 14 (common bus 16). The input/output circuit 32a receives the controller output signals COUT that are output from the MPU 18, in synchronization with a timing signal that is output from the conversion control unit 28, and outputs the received signals to the signal holding unit 30. Besides, the input/output circuit 32a outputs the memory output signals MOUT that are held in the signal holding unit 30 as the controller input signals CIN, in synchronization with a timing signal output from the conversion control unit 28.

The input/output circuit 32b receives the memory output signals MOUT that are output from the memory chips 14, in synchronization with a timing signal output from the conversion control unit 28, and outputs the received signals to the signal holding unit 30. The input/output circuit 32b also outputs the controller output signals COUT that are held in the signal holding unit 30 as memory input signals MIN receivable (recognizable) to the respective memory chips 14, in synchronization with a timing signal output from the conversion control unit 28.

That is, the conversion control unit 28 controls the operation timing and input/output directions of the input/output circuits 32a and 32b.

The controller output signals COUT include address signals, command signals, and write data signals output from the MPU 18. The controller input signals CIN include read data signals to be supplied from the memory chips 14 to the MPU 18. The address signals output from the MPU 18 contain upper address signals for generating the decode signals of the memory chips 14a, 14b, and 14c (chip enable signals to be described later).

The memory output signals MOUT include read data signals output from the memory chips 14. The memory input signals MIN include address signals, command signals, and write data signals to be supplied to the memory chips 14. Among the memory output signals MOUT not included in the common bus 16 are status signals (busy signals) to be output from the flash memories 14b and 14c. Among the memory input signals MIN not included in the common bus 16 are the chip enable signals and chip select signals.

As described above, the memory controller 22 converts the controller output signals COUT output from the processor 18 into the memory input signals MIN receivable to the memory chips 14 according to the operation specifications of the memory chips 14 to operate. The memory chips 14 receive the memory input signals MIN through the common bus 16 and perform a read operation, a write operation, or the like. The memory controller 22 also receives the memory output signals MOUT output from the memory chips 14 through the common bus 16 and converts the received signals into controller input signals CIN which are receivable to the MPU 18.

Figure 4:
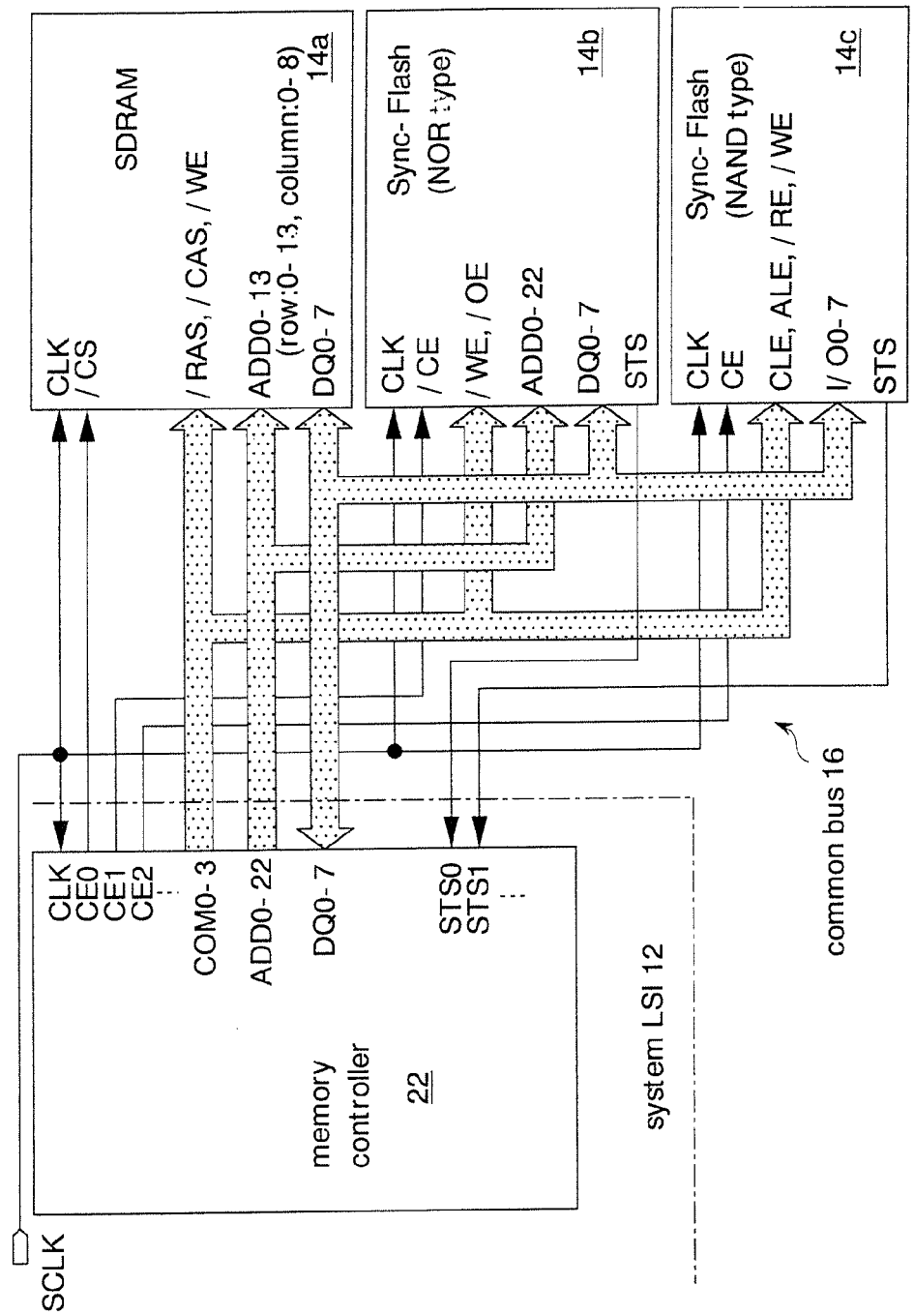
FIG. 4 is a wiring diagram showing the details of the common bus of FIG. 2.

FIG. 4 shows the details of the signals for connecting the memory controller 22 and the memory chips 14a, 14b, and 14c. In the diagram, the shaded thick arrows and the system clock signal line SCLK are included in the common bus 16.

The memory controller 22 (system LSI 12) has a clock terminal CLK and a plurality of status terminals STS0 and STS1 as input terminals, a plurality of chip enable terminals CE0, CE1, CE2, . . . , 4-bit command terminals COM0-COM3, and 23-bit address terminals ADD0-ADD22 as output terminals, and 8-bit data input/output terminals DQ0-DQ7 as input/output terminals.

The SDRAM 14a has a clock terminal CLK, a chip select terminal /CS, command terminals /RAS, /CAS, and /WE, and address terminals ADD0-ADD13 (including bank address terminals) as input terminals, and data input/output terminals DQ0-DQ7 as input/output terminals. Since the SDRAM 14a adopts an address multiplex system, the address terminals ADD0-ADD13 are supplied with a row address RA0-RA13 and a column address CA0-CA8 in succession. The upper two bits (RA12, RA13) of the row address signal are used as bank address signals.

The NOR type flash memory 14b has a clock terminal CLK, a chip enable terminal /CE, command terminals /WE and /OE, and address terminals ADD0-ADD22 as input terminals, a status terminal STS as an output terminal, and data input/output terminals DQ0-DQ7 as input/output terminals.

The NAND type flash memory 14c has a clock terminal CLK, a chip enable terminal CE, and command terminals CLE, ALE, /RE and /WE as input terminals, a status terminal STS as an output terminal, and data input/output terminals I/O0-I/O7 as input/output terminals.

Incidentally, the leading "/"s of terminal names indicate negative logic. In the following description, signals supplied through terminals will be designated by the same symbols as those of the terminals, like "clock signal CLK". Moreover, terminal names and signal names may be abbreviated, like "clock terminal CLK" as "CLK terminal" and "clock signal CLK" as "CLK signal".

The CLK terminals of the memory controller 22 and the memory chips 14a, 14b, and 14c are supplied with a system clock signal SCLK which is generated on the printed-circuit board 10 shown in FIG. 2. The CE0-CE2 terminals of the memory controller 22 are connected to the /CS terminal of the SDRAM 14a, the /CE terminal of the flash memory 14b, and the CE terminal of the flash memory 14c, respectively.

The memory controller 22 outputs signals of negative logic from the CE0 and CE1 terminals and a signal of positive logic from the CE2 terminal based on the information from the operation memory unit 24 shown in FIG. 3. The COM0-COM3 terminals of the memory controller 22 are connected to the command terminals of the SDRAM 14a and the flash memories 14b, 14c. When the SDRAM 14a is accessed, the COM3 terminal will not be used. Similarly, when the flash memory 14b is accessed, neither the COM2 terminal nor the COM3 terminal will be used.

The address terminals ADD0-ADD22 of the memory controller 22 are connected to the address terminals of the SDRAM 14a and the flash memory 14b. The flash memory 14c (NAND type) has no address terminal, and thus is not connected with the address terminals ADD0-ADD22.

The data input/output terminals DQ0-DQ7 of the memory controller 22 are connected to the data input/output terminals DQ0-DQ7, I/O0-I/O7 of the SDRAM 14a and the flash memories 14b, 14c. The STS0 and STS1 terminals of the memory controller 22 are connected to the STS terminals of the flash memories 14b and 14c, respectively.

As described above, the command signal lines, address signal lines, and data input/output signal lines for connecting the memory controller 22 to the SDRAM 14 and the flash memories 14b, 14c are shared to form the common bus. Therefore, the number of wires to be formed on the printed-circuit board 10 is reduced as compared to heretofore. This decreases, for example, the number of wiring layers on the printed-circuit board 10, lowering the design cost and fabrication cost of the printed-circuit board 10.

Since the number of terminals of the memory controller 22 is reduced as compared to heretofore, the system LSI 12 is prevented from growing in size depending on the number of terminals.

The system LSI 12 decreases in circuit scale, reducing the time necessary for design verification.

Figure 5:
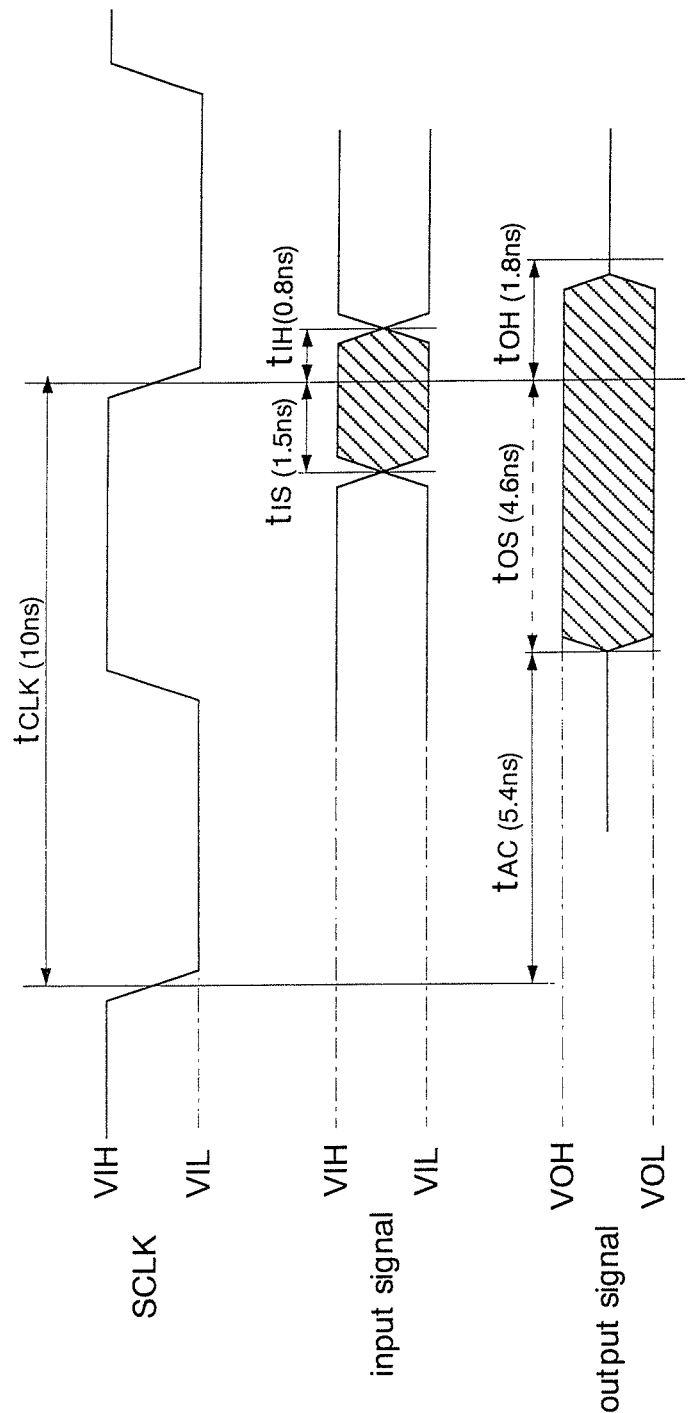
FIG. 5 is a waveform chart showing the interface specifications of the common bus of FIG. 2.

FIG. 5 shows the interface specifications of the common bus 16.

The input signals to be input to the common bus 16 must be settled a setup time tIS before a rising edge of the SCLK signal and maintained at the settled level (VIH or VIL) until a hold time tIH (input timing specification). The output signals to be output from the common bus 16 must be settled in output an access time tAC after a rising edge of the SCLK signal and maintained until a hold time tOH from another rising edge of the SCLK signal (output timing specification).

In this embodiment, the common bus 16 has a clock cycle tCLK of 10 ns. Here, the setup time tIS, the hold time tIH, the access time tAC, and the hold time tOH are defined as 1.5 ns, 0.8 ns, 5.4 ns, and 1.8 ns, respectively. Given that the clock cycle tCLK is 10 ns, the setup time tOS of an output signal with respect to the rising edge of the SCLK signal is 4.6 ns.

The memory controller 22 and the memory chips 14a, 14b, and 14c have only to input/output signals to/from the common bus 16 in accordance with the foregoing interface specifications. That is, simply defining the four times, i.e., the setup time tIS, the hold time tIH, the setup time tOS, and the hold time tOH allows transmission of commands, addresses, and data between the memory controller 22 and the memory chips 14a, 14b, and 14c through the common bus 16. Data can also be transmitted among the memory chips 14a, 14b, and 14c through the common bus 16. These interface specifications are characterized by that the input timing specification and the output timing specification remain the same for the memory chips 14a, 14b, and 14c. That is, the interface specifications are independent of the operation specifications inherent to the memory chips 14a, 14b, and 14c.

When clock synchronous memory chips are developed anew, the memory chips can be connected to the memory controller 22 by designing input/output circuits in accordance with the interface specifications shown in FIG. 5. That is, the memory chips can be attached to the system LSI externally without developing a new memory controller 22.

Note that the clock cycle tCLK is not limited to this example, but may be determined in accordance with the operating frequencies of the MPU core 18 and the memory chips 14a, 14b, and 14c. Here, some changes may be made to the setup times and hold times of the input and output signals according to the clock cycle tCLK.

On the printed-circuit board 10 shown in FIG. 2, the rules of the common bus 16, such as wiring length, are determined so as to meet the interface specifications shown in FIG. 5. When these rules are followed, signals that are supplied from the system LSI 12 to the common bus 16 in accordance with the requirements of the input timing specification are output to the memory chip 14a (or 14b, 14c) within the requirements of the output timing specification. Similarly, signals that are supplied from the memory chip 14a (or 14b, 14c) to the common bus 16 in accordance with the requirements of the input timing specification are output to the system LSI 12 within the requirements of the output timing specification.

Figure 6:
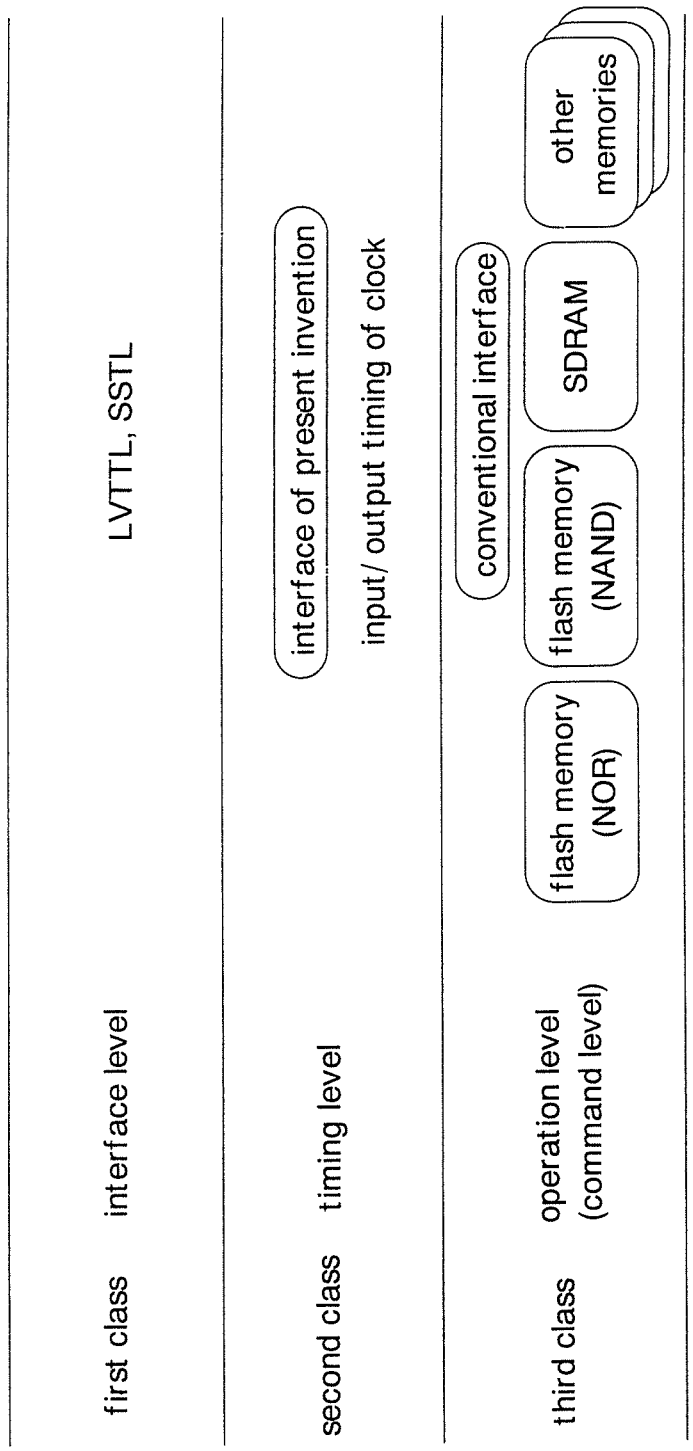
FIG. 6 is an explanatory diagram showing the interface classes of the memory system.

FIG. 6 shows the interface classes of the memory system.

In the diagram, the first class is an interface level in which the rising and falling characteristics of signals are defined. In this class, the input/output characteristics of signals are determined as VLTTL, SSTL, or the like. The second class is a timing level in which the input/output timing of signals is defined with respect to the clock signal. The third class is an operation level (command level) to be defined depending on the operation specifications of the respective memory chips.

Figure 1:
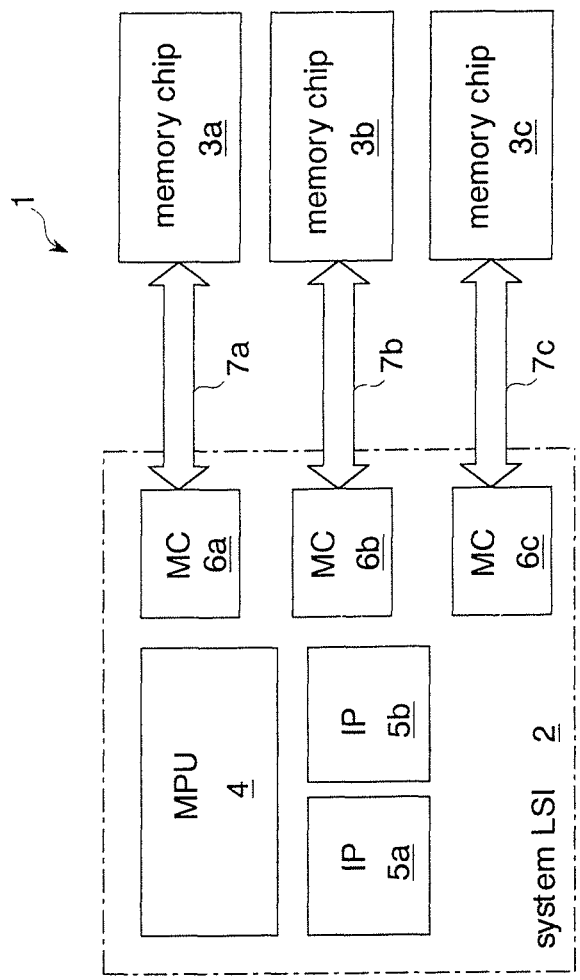
FIG. 1 is a block diagram showing a memory system having conventional memory chips.

In the present embodiment, the memory controller 22 and the memory chips 14a, 14b, and 14c are interfaced at the second class (timing level). Accordingly, the command signals, address signals, and data input/output signals can be shared as the common bus 16 among the plurality of types of memory chips 14a, 14b, and 14c. The conventional memory system shown in FIG. 1 was interfaced at the third level (operation level). For this reason, the bus wiring was conventionally required for each memory chip.

Figure 7:
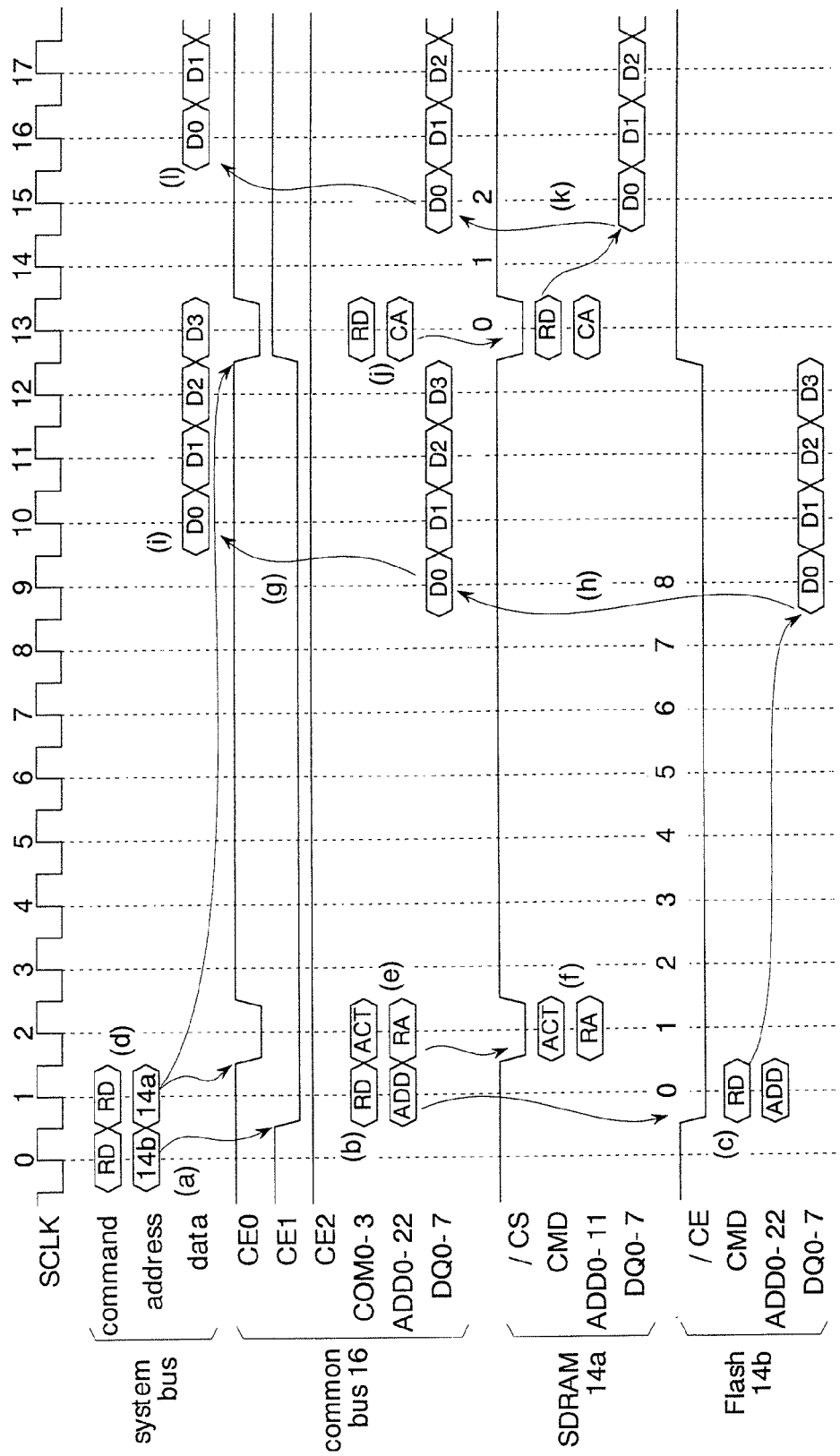
FIG. 7 is a timing chart showing read operations of the NOR type flash memory and the SDRAM in the first embodiment.

FIG. 7 shows an example where the system LSI accesses the NOR type flash memory 14b and the SDRAM 14a in succession to perform read operations. The "system bus" in the diagram shows signals to be transmitted between the MPU 18 and the memory controller 22. The "common bus 16" shows signals to be transmitted between the memory controller 22 and the SDRAM 14a (or the flash memory 14b).

The MPU 18 outputs a read command RD and an address (14b) in synchronization with the initial SCLK signal (0th) (FIG. 7(a)). The memory controller 22 decodes an upper address out of the address (14b) supplied to the system bus, to detect that the MPU 18 is requesting access to the flash memory 14b.

The conversion control unit 28 shown in FIG. 3 receives, for example, read operation specifications (1)-(3) of the flash memory 14b from the operation memory unit 24.
(1) A read operation is started upon the reception of a read command RD and a read address ADD.
(2) A read latency is "8". That is, first data is output at the eighth clock after the supply of the read command RD.
(3) Read data has a burst length of "4".

The memory controller 22 activates the CE1 signal (/CE signal) in synchronization with the rising edge of the next SCLK signal (first), and outputs a read command RD and a read address ADD to the flash memory 14b (FIG. 7(b)). Here, the memory controller 22 outputs the CE1 signal, the read command RD, and the read address ADD in accordance with the interface specifications for input signals shown in FIG. 5. The flash memory 14b receives the read command RD and the read address ADD through the common bus 16 (FIG. 7(c)), and performs a read operation. Here, the read command RD, the read address ADD, and the CE1 signal that the flash memory 14b receives from the common bus 16 meet the interface specifications for output signals shown in FIG. 5.

The MPU 18 outputs a read command RD and an address (14a) in synchronization with the first SCLK signal (FIG. 7(d)). The memory controller 22 decodes an upper address out of the address (14a) supplied to the system bus, to detect that the MPU 18 is requesting access to the SDRAM 14a.

The conversion control unit 28 shown in FIG. 3 receives, for example, read operation specifications (1)-(4) of the SDRAM 14a from the operation memory unit 24.
(1) A read operation is started upon the reception of an active command ACT and a row address signal RA. The row address signal RA is the 14 upper bits of an address, including bank address signals BA0 and BA1.
(2) A read command RD and a column address signal CA become receivable one or more clocks after the supply of the active command ACT. The column address signal CA is the nine lower bits of the address.
(3) A read latency is "2". That is, first data is output at the second clock after the supply of the read command RD.
(4) Read data has a burst length of "4".

The memory controller 22 activates the CE0 signal (/CS signal) in synchronization with the rising edge of the next SCLK signal (second), and outputs an active command ACT and a row address RA to the SDRAM 14a (FIG. 7(e)). Here, the memory controller 22 outputs the CE0 signal, the active command ACT, and the row address RA in accordance with the interface specifications for input signals shown in FIG. 5. The SDRAM 14a receives the active command ACT and the row address RA through the common bus 16 (FIG. 7(f)), and operates such internal circuits as a row decoder and a sense amplifier. Here, the active command ACT, the row address RA, and the CE0 signal that the SDRAM 14a receives from the common bus 16 meet the interface specifications for output signals shown in FIG. 5. Incidentally, the internal circuits of the SDRAM 14a operate even after the inactivation of the /CS signal.

Based on the information from the operation memory unit 24, the conversion control unit 28 shown in FIG. 3 determines that the read command RD to the SDRAM 14a cannot be supplied until after the output of data from the flash memory 14b. Therefore, the memory controller 22 keeps the CE1 signal activated (FIG. 7(g)).

The flash memory 14b outputs read data signals D0-D3 to the common bus 16 in succession (FIG. 7(h)). Here, the flash memory 14b outputs the read data signals D0-D3 in accordance with the interface specifications for input signals shown in FIG. 5. The memory controller 22 receives the read data signals D0-D3 with the input/output circuit 32b of FIG. 3 in succession, and temporarily stores the received data into the signal holding unit 30. Here, the read data signals D0-D3 that the memory controller 22 receives from the common bus 16 meet the interface specifications for output signals shown in FIG. 5. The conversion control unit 28 controls the signal holding unit 30 and the input/output circuit 32a so that the held data is successively output to the system bus in synchronization with the 10th and subsequent SCLK signals (FIG. 7(i)). Then, the read operation of the flash memory 14b is completed.

Next, the memory controller 22 activates the CE0 signal in synchronization with the 13th SCLK signal, and outputs a read command RD and a column address signal CA (FIG. 7(j)). The SDRAM 14a outputs read data signals D0-D3 to the common bus 16 in succession two clocks after the supply of the read command RD (FIG. 7(k)). The memory controller 22 receives the read data signals D0-D3 with the input/output circuit 32b in succession, and temporarily stores the received data into the signal holding unit 30. Here, the read data signals D0-D3 that the memory controller 22 receives from the common bus 16 meet the interface specifications for output signals shown in FIG. 5. The conversion control unit 28 controls the signal holding unit 30 and the input/output circuit 32a so that the held data is successively output to the system bus in synchronization with the 16th and subsequent SCLK signals (FIG. 7(l)). Then, the read operation of the SDRAM 14a is completed.

Figure 8:
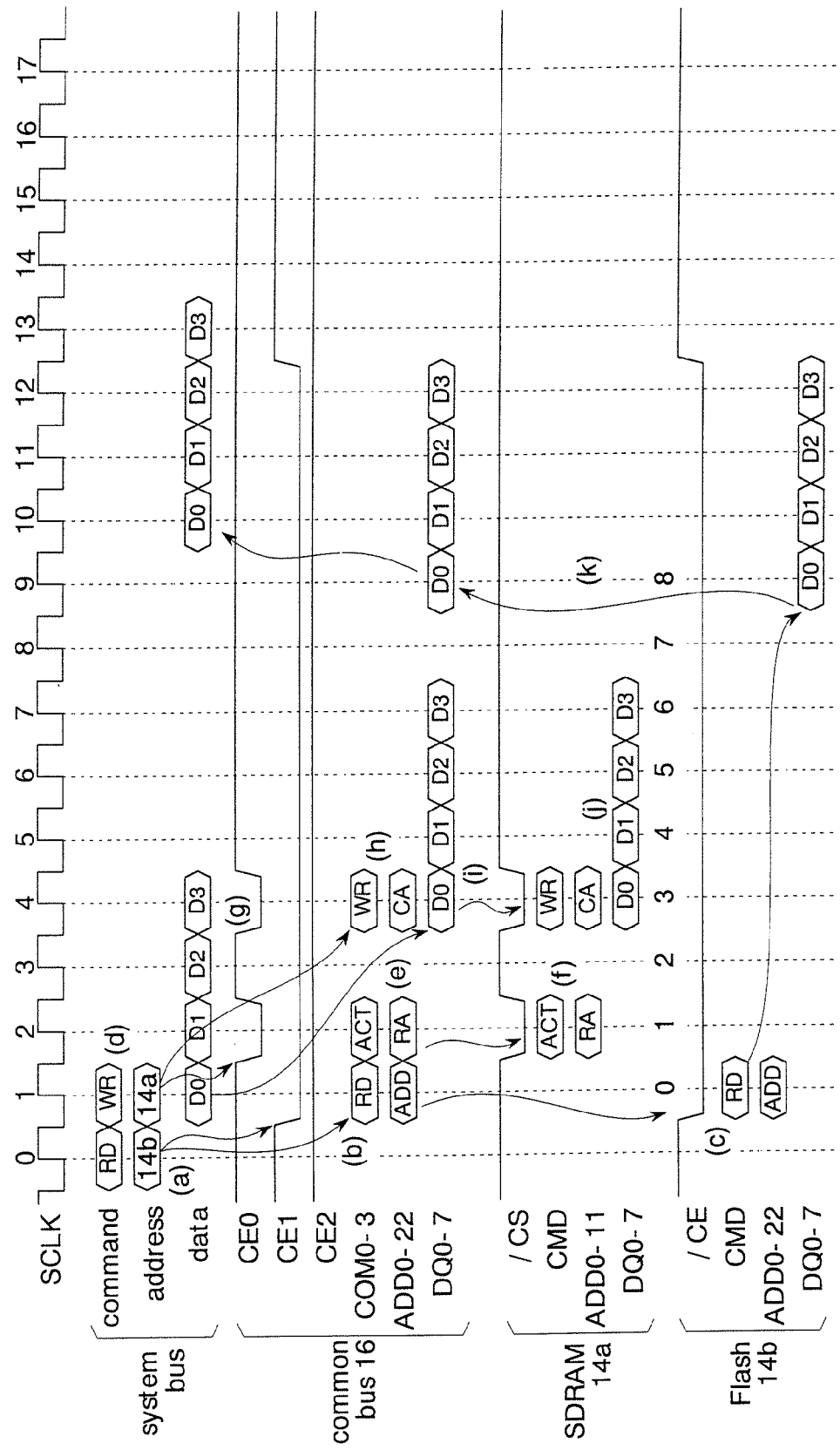
FIG. 8 is a timing chart showing a read operation of the NOR type flash memory and a write operation of the SDRAM in the first embodiment.

FIG. 8 shows an example where the system LSI accesses the NOR type flash memory 14b and the SDRAM 14a in succession to perform a read operation of the flash memory 14b and a write operation of the SDRAM 14a. Detailed description will be omitted of the same operations as those of FIG. 7.

The MPU 18 outputs a read command RD and an address (14b) in synchronization with the initial SCLK signal (0th) (FIG. 8(a)). The memory controller 22 activates the CE1 signal (/CE signal) in synchronization with the rising edge of the next SCLK signal (first), and outputs a read command RD and a read address ADD to the flash memory 14b (FIG. 8(b)). The flash memory 14b receives the read command RD and the read address ADD through the common bus 16 (FIG. 8(c)), and performs a read operation.

The MPU 18 outputs a write command WR and a write address (14a) in synchronization with the first SCLK signal (FIG. 8(d)). The MPU 18 successively outputs write data signals D0-D3 in synchronization with the first to fourth SCLK signals. These commands, addresses, and data are temporarily stored into the signal holding unit 30. The memory controller 22 decodes an upper address out of the address (14a) supplied to the system bus, to detect that the MPU 18 is requesting access to the SDRAM 14a. The conversion control unit 28 shown in FIG. 3 receives, for example, write operation specifications (1)-(4) of the SDRAM 14a from the operation memory unit 24.
(1) A write operation is started upon the reception of an active command ACT and a row address signal RA. The row address signal RA is the 14 upper bits of an address, including the bank address signals BA0 and BA1.
(2) A write command WR and a column address signal CA become receivable one or more clocks after the supply of the active command ACT. The column address signal CA is the nine lower bits of the address.
(3) A write latency is "0". That is, write data signals are successively output along with the write command WR.
(4) Write data has a burst length of "4".

The memory controller 22 activates the CE0 signal (/CS signal) in synchronization with the rising edge of the second SCLK signal, and outputs an active command ACT and a row address RA to the SDRAM 14a (FIG. 8(e)). The SDRAM 14a receives the active command ACT and the row address RA through the common bus 16 (FIG. 8(f)), and operates such internal circuits as a row decoder and a sense amplifier.

Based on the information from the operation memory unit 24, the conversion control unit 28 shown in FIG. 3 determines that the write command WR to the SDRAM 14a can be supplied before the output of data from the flash memory 14b. Accordingly, the controller 22 reactivates the CE0 signal (FIG. 8(g)), and outputs a write command WR and a column address signal CA to the common bus 16 in synchronization with the fourth SCLK signal (FIG. 8(h)). The memory controller 22 successively outputs the write data signals D0-D3 to the common bus 16 in synchronization with the fourth to seventh SCLK signals (FIG. 8(*i*)). The SDRAM 14*a* accepts the write data signals D0-D3 in succession and performs a write operation (FIG. 8(*j*)).

Subsequently, as in FIG. 7, the flash memory 14*b* outputs read data signals D0-D3 to the common bus 16 in succession at and after the eighth clock from the supply of the read command RD, thereby performing a read operation (FIG. 8(*k*)).

Figure 9:
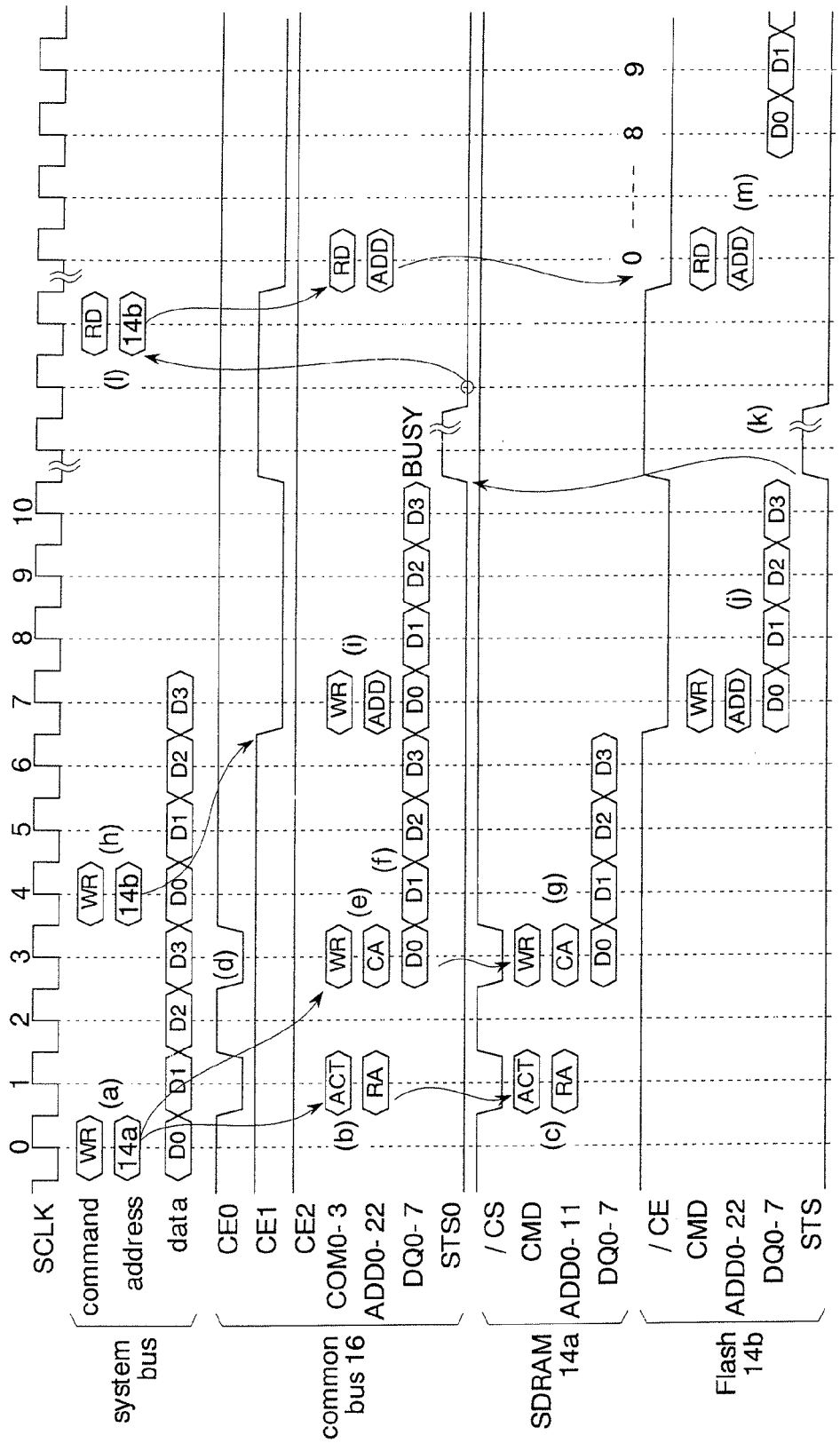
FIG. 9 is a timing chart showing write operations of the NOR type flash memory and the SDRAM in the first embodiment.

FIG. 9 shows an example where the system LSI accesses the SDRAM 14*a* and the NOR type flash memory 14*b* in succession to perform a write operation of the SDRAM 14*a* and a write operation of the flash memory 14*b*. Detailed description will be omitted of the same operations as those of FIGS. 7 and 8.

The MPU 18 outputs a write command WR and an address (14*a*) in synchronization with the initial SCLK signal (0th) (FIG. 9(*a*)). The MPU 18 successively outputs write data signals D0-D3 in synchronization with the zeroth to third SCLK signals. The memory controller 22 decodes an upper address out of the address (14*a*) supplied to the system bus, to detect that the MPU 18 is requesting access to the SDRAM 14*a*.

The memory controller 22 activates the CE0 signal (/CS signal) in synchronization with the rising edge of the first SCLK signal, and outputs an active command ACT and a row address RA to the SDRAM 14*a* (FIG. 9(*b*)). The SDRAM 14*a* receives the active command ACT and the row address RA (FIG. 9(*c*)), and operates such internal circuits as a row decoder and a sense amplifier.

Since the system bus is not supplied with a next command, the controller 22 reactivates the CE0 signal in synchronization with the third SCLK signal (FIG. 9(*d*)), and outputs a write command WR and a column address signal CA to the common bus 16 (FIG. 9(*e*)). The memory controller 22 successively outputs the write data signals D0-D3 to the common bus 16 in synchronization with the third to sixth SCLK signals (FIG. 9(*f*)). The SDRAM 14*a* accepts the write data signals D0-D3 in succession and performs a write operation (FIG. 9(*g*)).

The MPU 18 outputs a write command WR and an address (14*b*) in synchronization with the fourth SCLK signal (FIG. 9(*h*)). The MPU 18 successively outputs write data signals D0-D3 in synchronization with the fourth to seventh SCLK signals. The memory controller 22 decodes an upper address out of the address (14*b*) supplied to the system bus, to detect that the MPU 18 is requesting access to the flash memory 14*b*.

The conversion control unit 28 shown in FIG. 3 receives, for example, write operation specifications (1)-(5) of the flash memory 14*b* from the operation memory unit 24.
(1) A write operation is started upon the reception of a write command WR and a write address ADD.
(2) A write latency is "0". That is, write data signals are successively output along with the write command WR.
(3) Write data has a burst length of "4".
(4) After the write data signals are received, the STS signal is kept at a high level until the completion of the data write (BUSY period).
(5) No command, address, nor data can be input during the BUSY period.

The conversion control unit 28 receives from the arbiter 26 the information indicating that the SDRAM 14*a* is in operation. The conversion control unit 28 makes the signal holding unit 30 hold the command, address, and data for the flash memory 14*b* which are supplied from the MPU 18. The signal holding unit 30 is controlled by the conversion control unit 28 so as to output the held write command WR, write address ADD, and write data signals D0-D3 in synchronization with the seventh and subsequent SCLK signals at which the operation of the SDRAM 14*a* is completed. Then, the write operation of the flash memory 14*b* is performed (FIG. 9(*j*)).

The flash memory 14*b* activates the STS signal while performing the write operation, thereby notifying the memory controller 22 of the busy state (FIG. 9(*k*)). The memory controller 22 monitors the STS signal in synchronization with the SCLK signal. The memory controller 22 detects the STS signal turning to a low level, and then informs the MPU 18 that the flash memory 14*b* is in a ready state. The MPU 18 is informed of the ready state, for example, via the signal line of a BUSY signal formed on the system bus.

To verify that the flash memory 14*b* is written with correct data, the MPU 18 instructs a read operation under the address identical to the write address (FIG. 9(*l*)). Then, a read operation of the flash memory 14*b* is performed at the same timing as in FIG. 7 (FIG. 9(*m*)).

Figure 10:
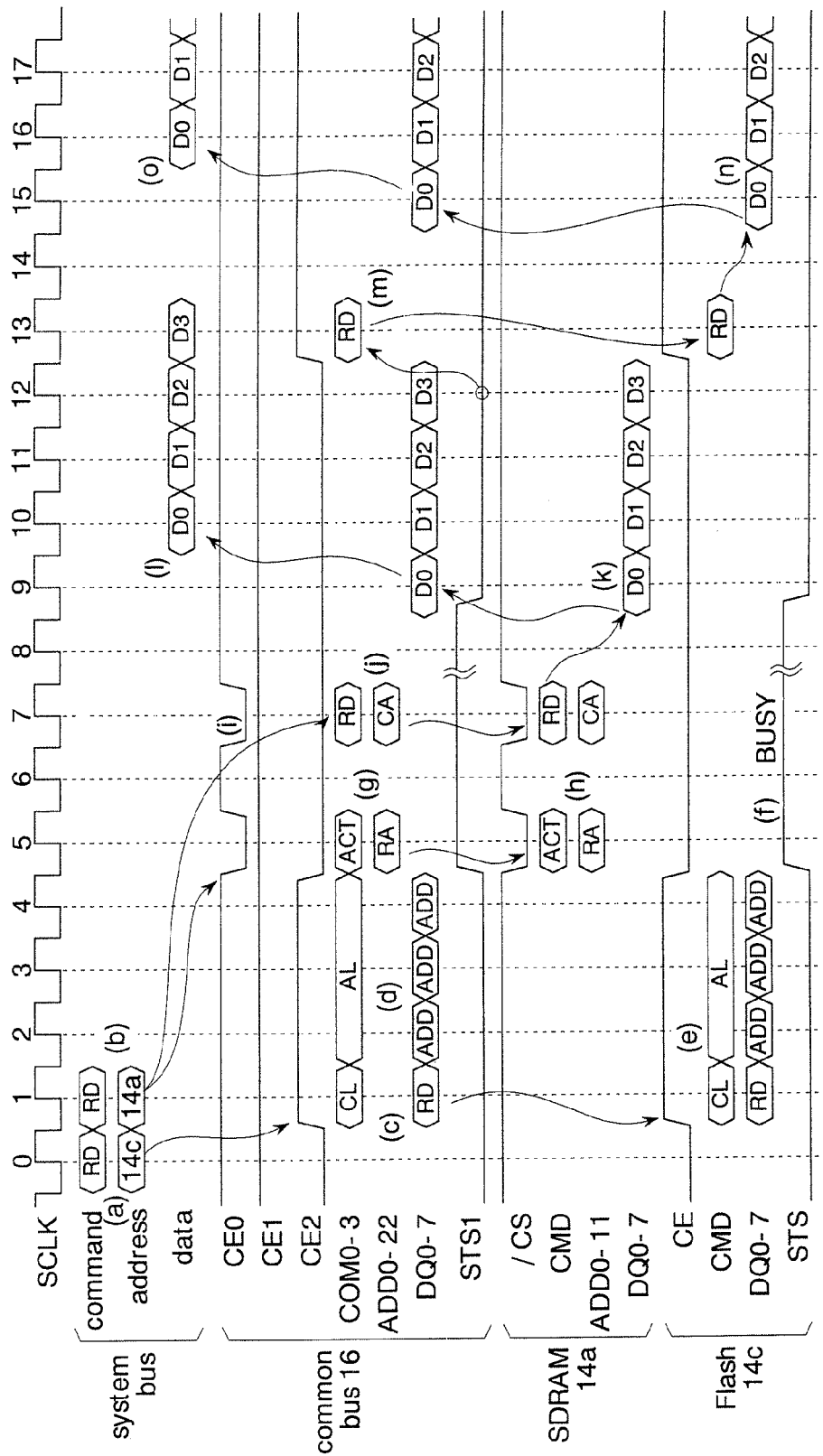
FIG. 10 is a timing chart showing read operations of the NAND type flash memory and the SDRAM in the first embodiment.

FIG. 10 shows an example where the system LSI accesses the NAND type flash memory 14*c* and the SDRAM 14*a* in succession to perform read operations. Detailed description will be omitted of the same operations as those of FIG. 7.

The MPU 18 outputs a read command RD and an address (14*c*) in synchronization with the initial SCLK signal (0th) (FIG. 10(*a*)). The memory controller 22 decodes an upper address out of the address (14*c*) supplied to the system bus, to detect that the MPU 18 is requesting access to the flash memory 14*c*.

The conversion control unit 28 shown in FIG. 3 receives, for example, read operation specifications (1)-(5) of the flash memory 14*c* from the operation memory unit 24.
(1) A read operation is started when a command latching signal CL and a read command RD are received at the command terminals COM0-COM3 and the data input/output terminals DQ0-DQ7, respectively, in synchronization with a clock signal.
(2) An address latching signal AL and read address signals ADD (start address) are received in synchronization with the second to fourth clock signals.
(3) A read data length is set in a mode register or the like ("4" in this example).
(4) After the read address is received, the STS signal is kept at a high level until read data signals become ready for output (BUSY period).
(5) No command, address, nor data can be input during the BUSY period.

The MPU 18 outputs a read command RD and an address (14*a*) in synchronization with the first SCLK signal (FIG. 10(*b*)). The memory controller 22 decodes an upper address out of the address (14*a*) supplied to the system bus, to detect that the MPU 18 is requesting access to the SDRAM 14*a*. The read command RD and the address (14*a*) are temporarily held in the signal holding unit 30.

The memory controller 22 activates the CE2 signal (CE signal) in synchronization with the rising edge of the first SCLK signal, and outputs a command latching signal CL and a read command RD to the flash memory 14*c* (FIG. 10(*c*)). The memory controller 22 successively outputs an address latching signal AL and address signals ADD (start address) in synchronization with the second to fourth SCLK signals (FIG. 10(*d*)).

The flash memory 14*c* receives the command latching signal CL, the read command RD, the address latching signal AL, and the address signals ADD through the common bus 16 in succession (FIG. 10(*e*)), and performs a read operation.

Incidentally, the read operation (internal operation of the flash memory 14c) is performed even after the inactivation of the CE signal.

The flash memory 14c activates the STS signal until read data signals become ready for output, thereby notifying the memory controller 22 of the busy state (FIG. 10(f)).

Based on the information from the operation memory unit 24, the conversion control unit 28 determines that the read operation of the SDRAM 14a can be performed before the reception of the read data signals from the flash memory 14c. The memory controller 22 activates the CE0 signal (/CS signal) in synchronization with the rising edge of the fifth SCLK signal, and outputs an active command ACT and a row address RA to the SDRAM 14a (FIG. 10(g)). The SDRAM 14a receives the active command ACT and the row address RA (FIG. 10(h)), and operates such internal circuits as a row decoder and a sense amplifier.

The memory controller 22 reactivates the CE0 signal in synchronization with the seventh SCLK signal (FIG. 10(i)), and outputs a read command RD and a column address signal CA (FIG. 10(j)). The SDRAM 14a outputs read data signals D0-D3 to the common bus 16 in succession two clocks after the supply of the read command RD (FIG. 10(k)). The conversion control unit 28 controls the signal holding unit 30 and the input/output circuit 32a so that the read data signals D0-D3 from the SDRAM 14a that are held in the signal holding unit 30 are successively output to the system bus in synchronization with the ninth and subsequent SCLK signals (FIG. 10(l)). Then, the read operation of the SDRAM 14a is completed.

Next, the memory controller 22 monitors the STS signal in synchronization with the SCLK signal. The memory controller 22 detects the STS signal turning to a low level, and then activates the CE2 signal and outputs a read command RD (FIG. 10(m)). The flash memory 14c outputs read data signals D0-D3 in succession two clocks after the reception of the read command RD (FIG. 10(n)).

The read data signals D0-D3 are successively output to the system bus in synchronization with the 16th and subsequent SCLK signals (FIG. 10(o)). Then, the read operation of the flash memory 14c is completed.

Figure 11:
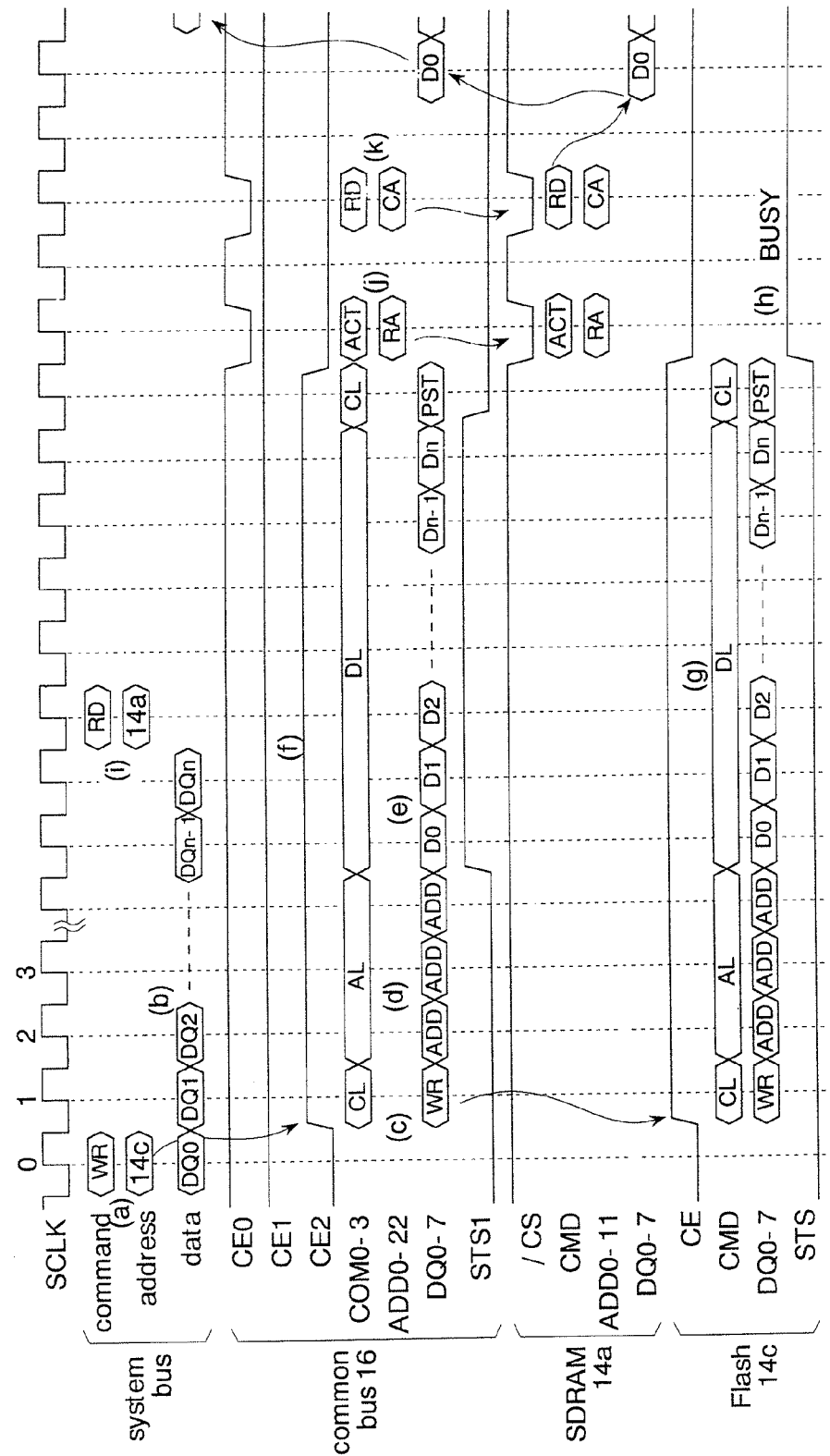
FIG. 11 is a timing chart showing a write operation of the NAND type flash memory and a read operation of the SDRAM in the first embodiment.

FIG. 11 shows an example where the system LSI accesses the NAND type flash memory 14c and the SDRAM 14a in succession to perform a write operation of the flash memory 14c and a read operation of the SDRAM 14a. Detailed description will be omitted of the same operations as those of FIG. 7.

The MPU 18 outputs a write command WR and an address (14c) in synchronization with the initial SCLK signal (0th) (FIG. 11(a)). In addition, the MPU 18 successively outputs write data signals DQ0-DQn in synchronization with the zeroth and subsequent SCLK signals (FIG. 11(b)). The memory controller 22 decodes an upper address out of the address (14c) supplied to the system bus, to detect that the MPU 18 is requesting access to the flash memory 14c.

The conversion control unit 28 shown in FIG. 3 receives, for example, write operation specifications (1)-(7) of the flash memory 14c from the operation memory unit 24.

(1) A write operation is started when a command latching signal CL and a write command WR are received at the command terminals COM0-COM3 and the data input/output terminals DQ0-DQ7, respectively, in synchronization with a clock signal.

(2) An address latching signal AL and write address signals ADD (start address) are received in synchronization with the second to fourth clock signals.

(3) In synchronization with the fifth and subsequent clock signals, a data latching signal DL and write data signals D0-Dn are received at the command terminals COM-COM3 and the data input/output terminals DQ0-DQ7, respectively.

(4) A read data length is set in a mode register or the like of the flash memory 14c ("n+1" in this example).

(5) In synchronization with the clock signal subsequent to the reception of the write data signal Dn, a command latching signal CL and a program start signal PST are received at the command terminals COM-COM3 and the data input/output terminals DQ0-DQ7, respectively.

(6) After the program start signal PST is received, the STS signal is kept at a high level until the completion of the data write (BUSY period).

(7) No command, address, nor data can be input during the BUSY period.

The memory controller 22 activates the CE2 signal (CE signal) in synchronization with the rising edge of the next SCLK signal (first), and outputs a command latching signal CL and a write command WR to the flash memory 14c (FIG. 11(c)). The memory controller 22 successively outputs an address latching signal AL and address signals ADD in synchronization with the second to fourth SCLK signals (FIG. 11(d)). The memory controller 22 successively outputs a data latched signal DL and write data signals DQ0-DQn in synchronization with the fifth and subsequent SCLK signals (FIG. 11(e)). The CE2 signal is kept at the high level until the output of a program start signal PST (FIG. 11(f)).

The flash memory 14c receives the command latching signal CL, the write command WR, the address latching signal AL, the address signals ADD, the data latching signal DL, and the write data signals DQ0-DQn through the common bus 16 in succession (FIG. 11(g)), and performs a read operation.

The flash memory 14c activates the STS signal until the completion of the write operation, notifying the memory controller 22 of the busy state (FIG. 11(h)).

The MPU 18 outputs a read command RD and an address (14a) to the flash memory 14c in synchronization with the SCLK signal subsequent to the output of the write data signal DQn (FIG. 11(i)). The memory controller 22 decodes an upper address out of the address (14a) supplied to the system bus, to detect that the MPU 18 is requesting access to the SDRAM 14a. The read command RD and the address (14a) are temporarily held in the signal holding unit 30.

Based on the information from the operation memory unit 24, the conversion control unit 28 determines that the read operation of the SDRAM 14a can be performed after the output of the read data signals to the flash memory 14c.

The memory controller 22 activates the CE0 signal (/CS signal) in synchronization with the rising edge of the SCLK signal subsequent to the output of the program start signal PST, and outputs an active command ACT and a row address RA to the SDRAM 14a (FIG. 11(j)). Then, as in FIG. 10, a read command RD and a column address signal CA are output from the memory controller 22 (FIG. 11(k)) so that the read operation of the SDRAM 14a is performed.

As has been described, in the present embodiment, the memory controller 22 converts controller output signals COUT output by the MPU 18 into memory input signals MIN receivable to the memory chips 14, according to the operation specifications of the respective memory chips 14. This allows the single memory controller 22 to access the plurality of types of memory chips 14. Since the plurality of memory chips 14 can be connected to the memory controller 22 through the common bus 16, the signal lines can be minimized in number. Besides, the memory controller 22 can be reduced in circuit scale.

The input timing specifications on the memory input signals MIN and the memory output signals MOUT which the memory controller 22 and the memory chips 14 respectively input to the common bus 16 is set identical irrespective of which of the memory chips 14 is to operate. Similarly, the output timing specifications on the memory output signals MOUT and the memory input signals MIN to be output to the memory controller 22 and the memory chips 14 through the common bus 16 is set identical irrespective of which of the memory chips 14 is to operate. Therefore, the memory controller 22 can make reliable access to the plurality of types of memory chips 14 having different operation specifications by simply adjusting the order of output of the memory input signals MIN and the order of acceptance of the memory output signals MOUT according to the command specifications of the memory chips 14.

The setup time tOS and the hold time tOH of the output timing specification are set longer than the setup time tIS and the hold time tIH of the input timing specification. Accordingly, the memory controller 22 and the individual memory chips 14 can surely receive the memory output signals MOUT and the memory input signals MIN through the common bus 16, respectively.

The input/output controlling unit 32, or the interface with the memory chips 14, outputs the memory input signals MIN and receives the memory output signals MOUT by operating under the timing according to the operation specifications of the respective memory chips 14. Consequently, it is possible to operate the memory chips 14 reliably without using complicated control circuits.

The controller output signals COUT and the memory output signals MOUT received at the input/output controlling unit 32 are temporarily held by the signal holding part 30. Therefore, the signals can be output to the memory chips 14 according to the operation specifications of the respective memory chips 14.

The signal holding unit 30 can hold controller output signals COUT until the common bus 16 becomes available. This allows the MPU 18 to access other devices, such as peripheral circuits, or the peripheral cores 20a, 20b, and 20c independent of the operation wait for the memory chips 14. Since the MPU 18 is prevented from executing useless cycles, the entire system can be improved in operating efficiency.

The operation memory unit 24 is composed of programmable logics that are capable of rewriting information stored in themselves. In addition, the arbiter 26 is composed of programmable logics that can reconstruct their respective circuit functions. On this account, the control timing of the memory controller 22 can be modified easily by programming the operation memory unit 24 and the arbiter 26 depending on the memory chips 14 to be connected to the memory controller 22. As a result, the memory controller 22 can be used as a controller that is common to a number of types of memory chips 14.

When access is requested of a plurality of memory chips 14, the order in which the memory chips 14 operates is adjusted by the arbiter 26 and the signal holding unit 30. This allows the single memory controller 22 to operate the plurality of types of memory chips 14 with efficiency. The memory system can be improved in data transmission rate.

The memory controller 22 can handle the plurality of types of memory chips 14 by itself, and thus can be made smaller in circuit scale. As a result, the system LSI 12 for mounting the memory controller 22 on can be reduced in chip size, lowering the cost of the memory system. Since the system LSI 12 decrease in circuit scale, it is possible to reduce the time necessary for the design verification of the system LSI 12.

The memory controller 22 is shared among the plurality of memory chips 14 to be mounted on the printed-circuit board 10. This can reduce the number of signal lines to be laid on the printed-circuit board 10, lowering the design cost and fabrication cost of the printed-circuit board 10.

Figure 12:
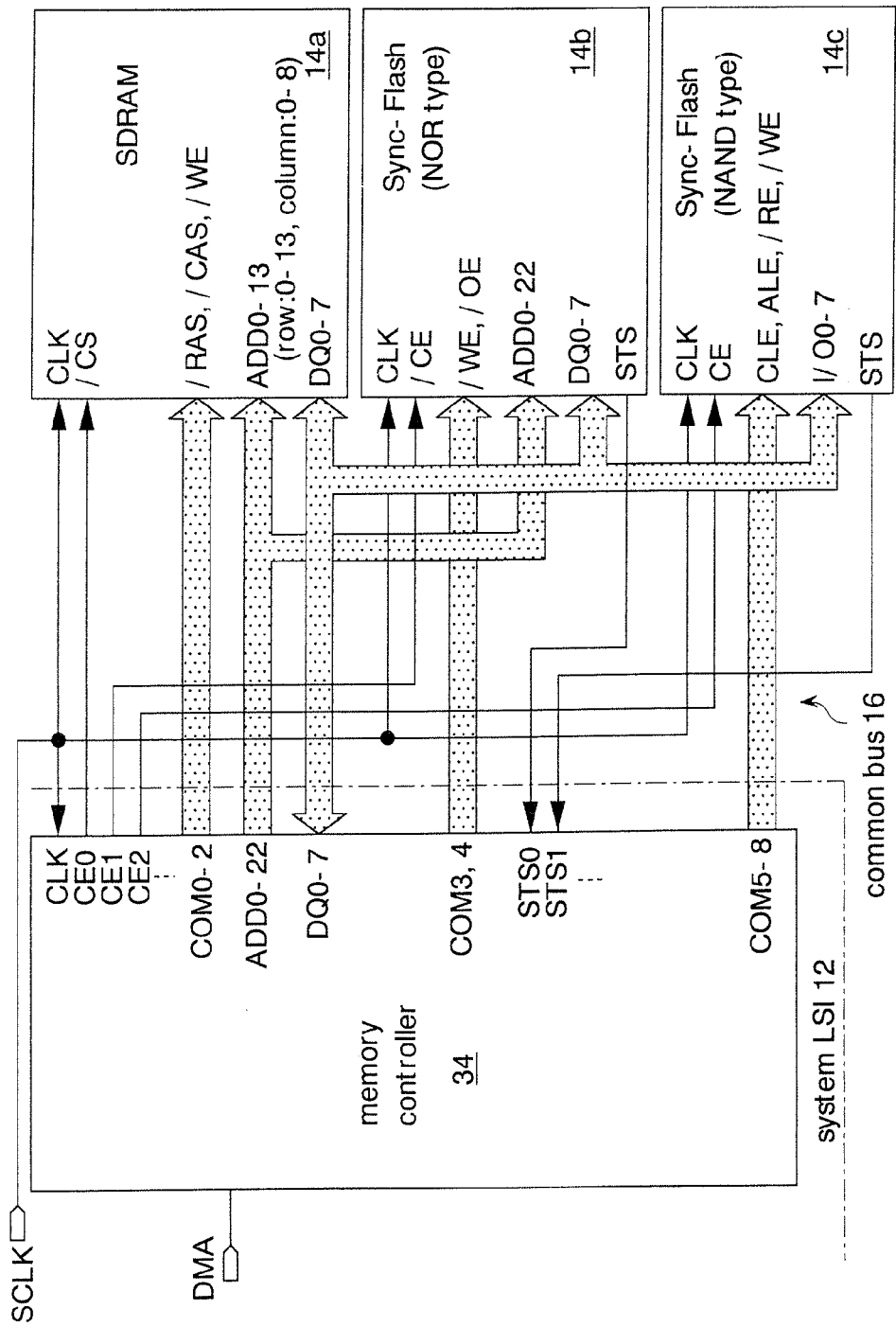
FIG. 12 is a wiring diagram showing the details of a common bus according to a second embodiment of the present invention.

FIG. 12 shows a second embodiment of the memory system in the present invention. The same circuits and signals as those described in the first embodiment will be designated by identical reference numbers or symbols. Detailed description thereof will be omitted here.

In this embodiment, a memory controller 34 has command terminals COM0-COM2, COM3-COM4, and COM5-COM8 corresponding to memory chips 14a, 14b, and 14c, respectively. That is, the shaded thick arrows and the system clock signal line SCLK in the diagram are included in a common bus 16. In addition, the memory controller 34 receives a control signal DMA which is output from a not-shown MPU 18. The DMA signal is activated (high level) when the MPU 18 instructs the memory controller 34 of DMA (Direct Memory Access) transfer. The other configuration is almost identical to that of the first embodiment described above.

Figure 13:
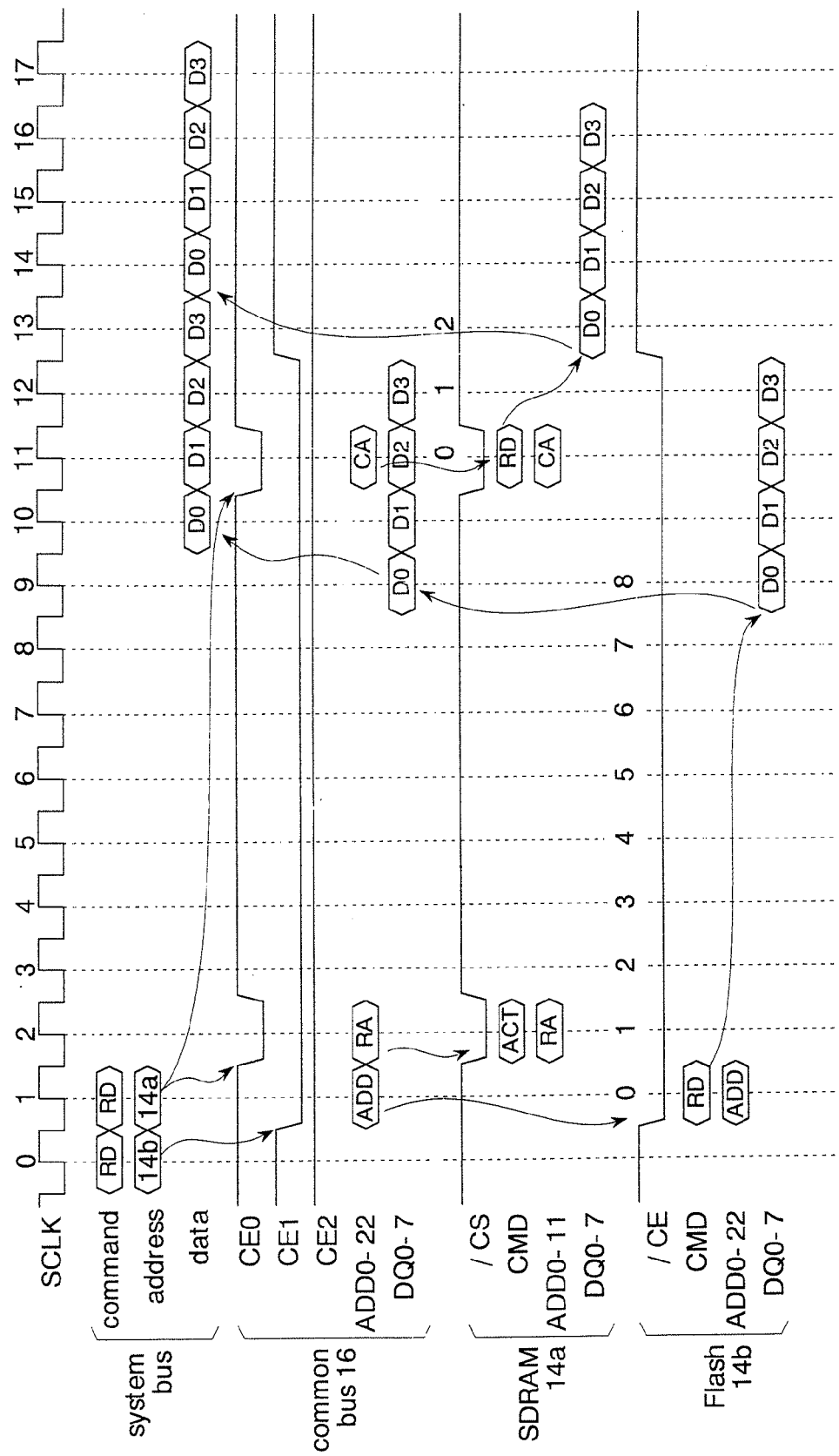
FIG. 13 is a timing chart showing read operations of the NOR type flash memory and the SDRAM in the second embodiment.

FIG. 13 shows an example where the system LSI accesses the NOR type flash memory 14b and the SDRAM 14a in succession to perform read operations. FIG. 13 shows operations corresponding to FIG. 7 of the first embodiment. Detailed description will be omitted of the same operations as those of FIG. 7.

Initially, the read operation of the flash memory 14b is performed as in FIG. 7. The memory controller 34 outputs a read command RD and a column address CA to the SDRAM 14a in synchronization with the 11th SCLK signal. This timing is two clocks earlier than in the first embodiment. Here, the CE0 signal and the CE1 signal are activated at the same time, while no signal collision occurs on the common bus 16. Then, the read data signals D0-D3 from the SDRAM 14a are output in synchronization with the 14th to 17th SCLK signals. The rest of the timing is the same as in FIG. 7.

Since the read data signals from the flash memory 14b and the read data signals D0-D3 from the SDRAM 14a are output continuously, the memory system improves in data transfer efficiency as compared to the first embodiment.

Figure 14:
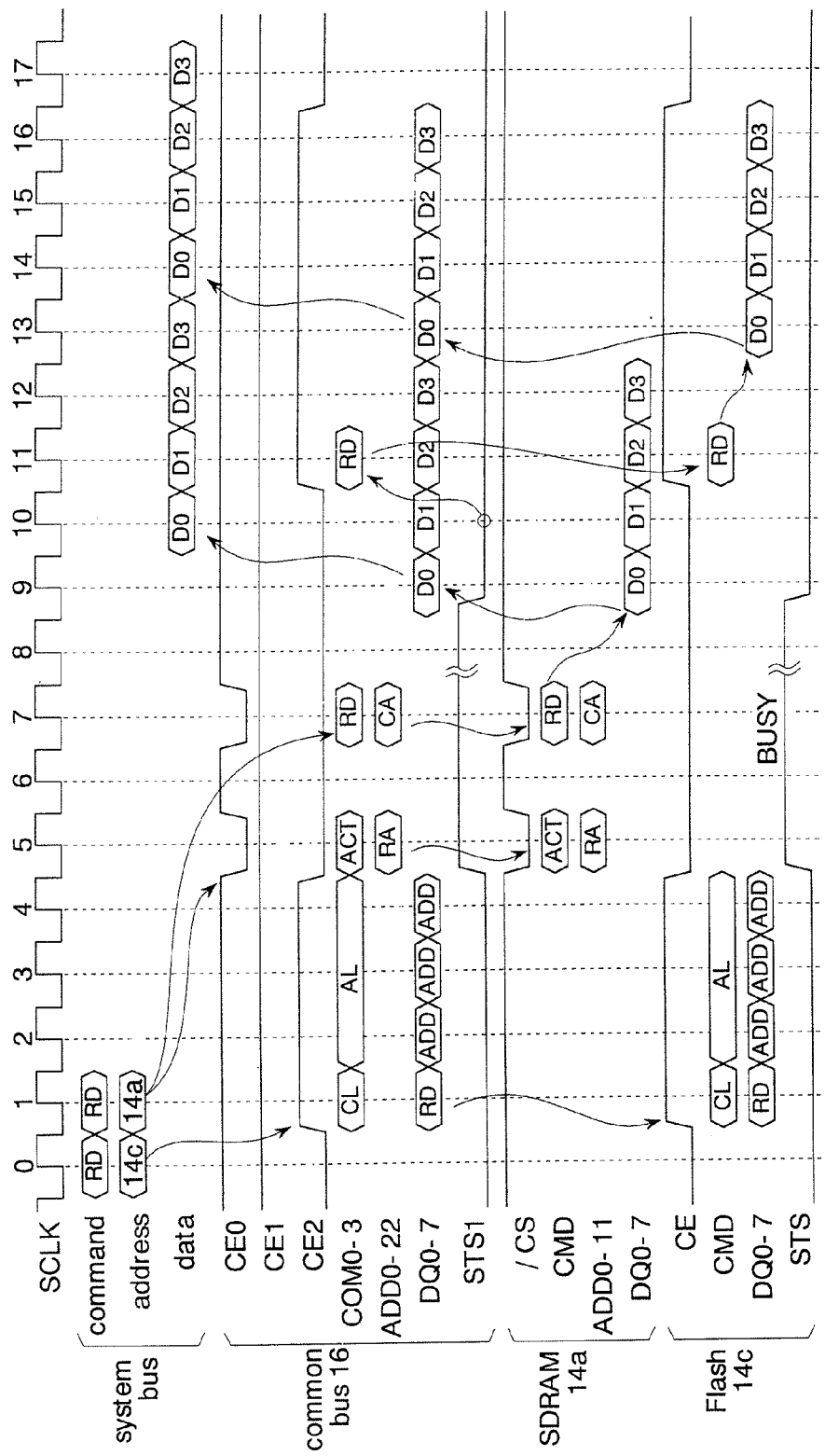
FIG. 14 is a timing chart showing read operations of the NAND type flash memory and the SDRAM in the second embodiment.

FIG. 14 shows an example where the system LSI accesses the NAND type flash memory 14c and the SDRAM 14a in succession to perform read operations. FIG. 14 shows operations corresponding to FIG. 10 of the first embodiment. Detailed description will be omitted of the same operations as those of FIG. 10.

Initially, the read operations of the flash memory 14c and the SDRAM 14a are started as in FIG. 10. The memory controller 34 outputs a read command RD to the flash memory 14c in synchronization with the 11th SCLK signal. This timing is two clocks earlier than in the first embodiment. Here, the CE0 signal and the CE2 signal are activated at the same time, while no signal collision occurs on the common bus 16. Then, the read data signals D0-D3 from the flash memory 14c are output in synchronization with the 14th to 17th SCLK signals. The rest of the timing is the same as in FIG. 10. Even in this example, the memory system improves in data transfer efficiency as compared to the first embodiment.

Figure 15:
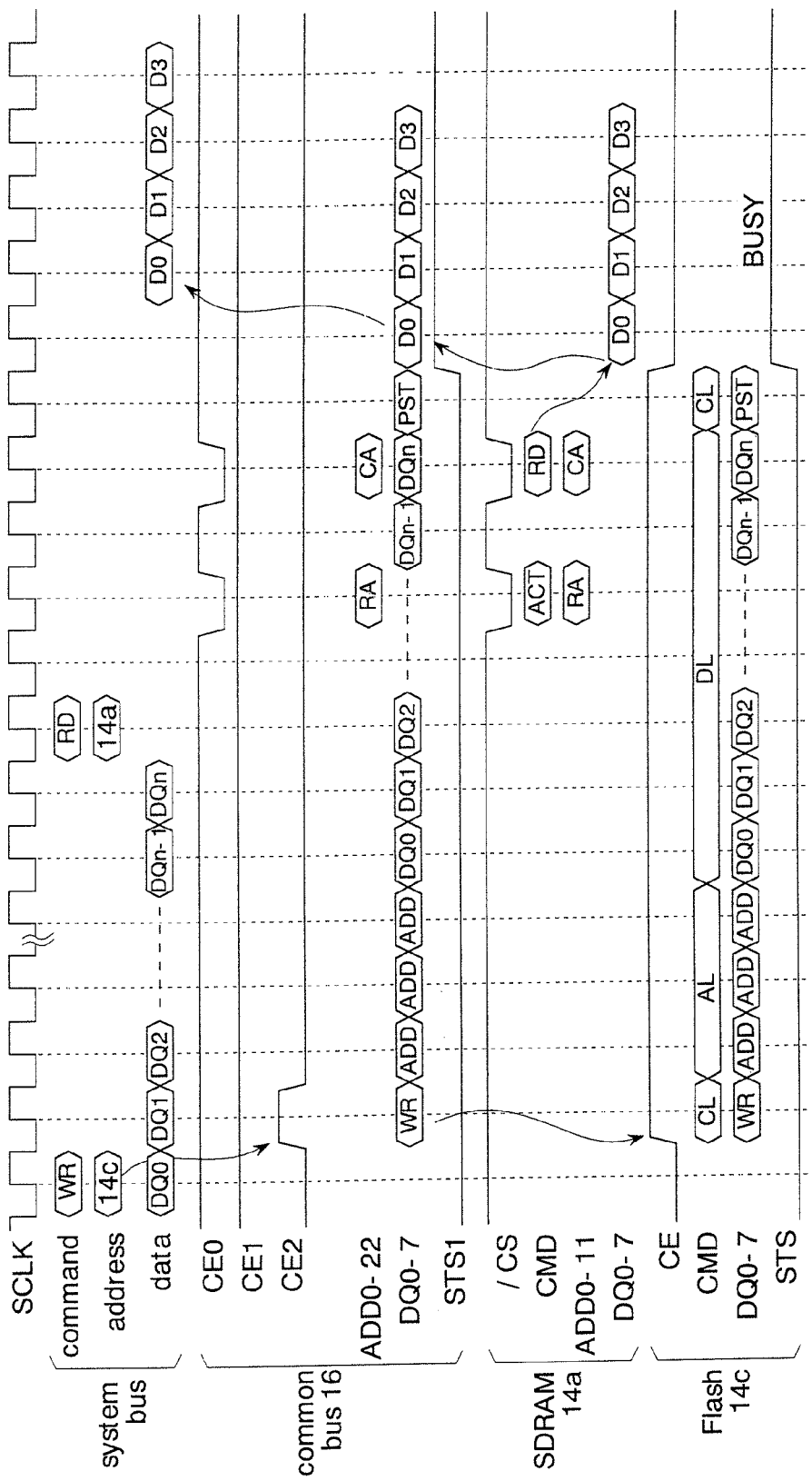
FIG. 15 is a timing chart showing a write operation of the NAND type flash memory and a read operation of the SDRAM in the second embodiment.

FIG. 15 shows an example where the system LSI accesses the NAND type flash memory 14c and the SDRAM 14a in succession to perform a write operation of the flash memory 14c and a read operation of the SDRAM 14a. FIG. 15 shows operations corresponding to FIG. 11 of the first embodiment. Detailed description will be omitted of the same operations as those of FIG. 11.

Initially, the write operation of the flash memory 14c is started as in FIG. 11. The memory controller 34 outputs an active command ACT and a read command RD to the SDRAM 14a while outputting write data signals to the flash memory 14c. This timing is four clocks earlier than in the first embodiment. Here, the CE0 signal and the CE2 signal are activated at the same time, while no signal collision occurs on the common bus 16. The rest of the timing is the same as in FIG. 11. Even in this example, the memory system improves in data transfer efficiency as compared to the first embodiment.

Figure 16:
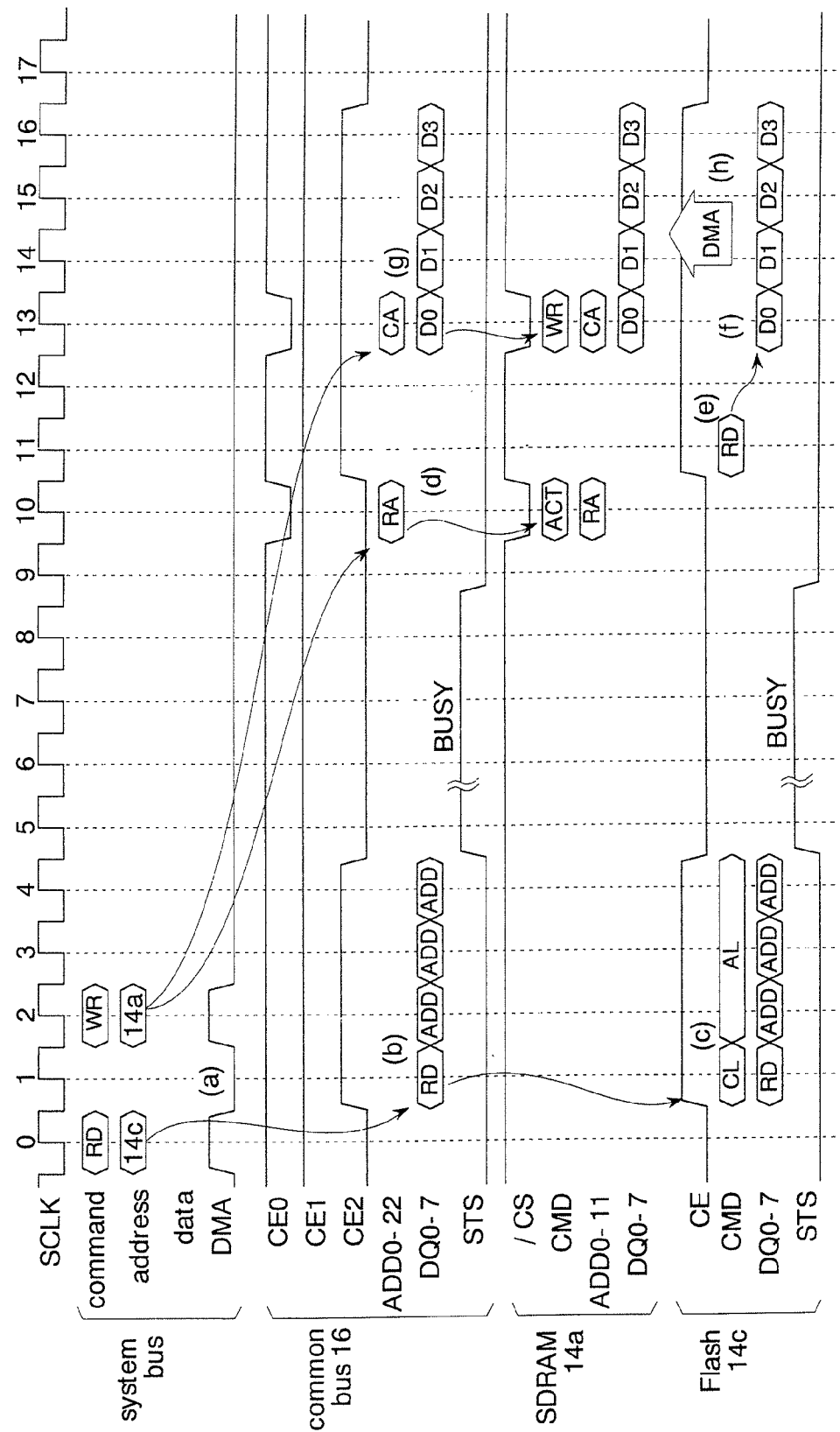
FIG. 16 is a timing chart showing DMA transfer from the NAND type flash memory to the SDRAM in the second embodiment.

FIG. 16 shows an example of DMA transfer from the flash memory 14c to the SDRAM 14a. The basic operations of the flash memory 14c and the SDRAM 14a are the same as in FIGS. 10 and 11 described above. Therefore, detailed description of the operations will be omitted here.

For DMA transfer, the MPU 18 turns the DMA signal to a high level when outputting the read command RD to the flash memory 14c and the write command WR to the SDRAM 14a (FIG. 16(a)). On account of DMA transfer, the MPU 18 outputs no write data signal. That is, only a write address AD and the write command WR are supplied to the SDRAM. The memory controller 34 activates the CE2 signal (CE signal) in synchronization with the rising edge of the first SCLK signal, and outputs the read command RD and read addresses ADD to the flash memory 14c (FIG. 16(b)). The flash memory 14c receives the read command RD and the read addresses ADD (FIG. 16(c)), and performs a read operation.

The memory controller 34 outputs an active command ACT and a row address RA to the SDRAM 14a in synchronization with the 10th SCLK signal (FIG. 16(d)). The memory controller 34 outputs a read command RD to the flash memory 14c in synchronization with the 11th SCLK signal (FIG. 16(e)).

The flash memory 14c outputs read data signals D0-D3 in succession two clocks after the supply of the read command RD (the 13th SCLK signal) (FIG. 16(f)). In synchronization with this 13th SCLK signal, the memory controller 34 outputs a write command WR and a column address CA to the SDRAM 14a (FIG. 16(g)). As a result, the read data output from the flash memory 14c are written to the SDRAM 14a via the common bus 16. That is, a DMA transfer is performed. During the DMA transfer, the memory controller 34 accepts none of the read data signals D0-D3.

As described above, this embodiment can offer the same effects as those obtained from the first embodiment described above. Moreover, in this embodiment, the signal lines of the command signals are separated from the common bus 16 and laid with respect to each memory chip. On this account, the memory controller 34 can activate a plurality of chip enable signals CE0-CE2 at a time. For example, a read command can be supplied to one memory chip while another memory chip is inputting/outputting data signals to the common bus 16. As a result, the memory system can be improved in data transmission rate.

The signal lines of the address signal ADD0-ADD22 and the data signal DQ0-DQ7 are included in the common bus 16, while the signal lines of the command signals are separated from the common bus 16 and laid for each memory chip. This facilitates DMA transfer between the memory chips. During the DMA transfer, the MPU 18 can access other peripheral circuits or IP cores. Consequently, the system improves in performance.

FIG. 17 shows a third embodiment of the memory system in the present invention.

In this embodiment, a system LSI 36, an SDRAM 38a, and flash memories 38b and 38c are stacked in three dimensions and molded in a single package (not shown). A common bus 16 is formed as interconnection wiring for connecting the individual chips via through holes that are formed in the peripheries of the respective chips. The common bus 16 has the same interface specifications as those of FIG. 5.

The system LSI 36, the SDRAM 38a, and the flash memories 38b and 38c have the same circuit configurations as those of the system LSI 12, the SDRAM 14a, and the flash memories 14b and 14c of the first embodiment. That is, the system LSI 36 includes the memory controller 22. The memory chips 38a, 38b, and 38c are clock synchronous semiconductor memories.

This embodiment can offer the same effects as those obtained from the first embodiment described above. Moreover, in this embodiment, the common bus 16 is formed as the interconnection wiring for connecting the individual chips 36, 38a, 38b, and 38c via the through holes formed in the peripheries of the respective chips. This makes it possible to form a memory system with a minimum mounting area. Sharing the memory controller among the plurality of memory chips can reduce the number of interconnection wires, thereby allowing an improvement in the reliability of the memory system stacked in three dimensions.

The first and second embodiments described above have dealt with the cases where the memory chips 14a, 14b, and 14c each have data input/output terminals of 8 bits. However, the present invention is not limited to such embodiments. For example, the data input/output terminals may be of 16 bits. Memory chips of 8 bits and 16 bits may be used together. In this case, the common bus has data input/output signal lines of 16 bits.

The first embodiment described above has dealt with the case where the memory system comprises the clock synchronous SDRAM 14a, the NOR type flash memory 14b, and the NAND type flash memory 14c. However, the present invention is not limited to such an embodiment. For example, the memory system may include a clock synchronous SSRAM (Synchronous SRAM).

The invention is not limited to the above embodiments and various modifications may be made without departing from the spirit and the scope of the invention. Any improvement may be made in part or all of the components.

What is claimed is:

1. A semiconductor device comprising:
   a processing unit;
   a memory controller configured to communicate with at least two different types of memory devices, the memory controller including:
   a first interface configured to receive control output signals from the processing unit to access at least one of the memory devices,
   a conversion circuit configured to covert the control output signals to memory input signals in accordance with operation specifications of the memory devices,
   a second interface configured to connect to the memory devices via a common line, the common line being shared by the memory devices, and configured to output a write enable signal as one of the memory input signals to the common line, and
   a third interface configured to connect to one of the memory devices via a signal line, the signal line being different from the common line, and configured to output a chip enable signal as one of the memory input signals to the signal line; and
   a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals, wherein the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

2. The semiconductor device of claim 1, wherein the plurality of terminals are disposed in a peripheral area of the semiconductor device.

3. The semiconductor device of claim 1, wherein each of the second interface and the third interface is electrically connected to one or more of the plurality of terminals.

4. The semiconductor device of claim 1, wherein at least one of the plurality of terminals form a part of the common line.

5. A memory system comprising
at least two different types of memory devices and
a semiconductor device including:
a processing, unit;
a memory controller configured to communicate with the memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line, and
a third interface configured to connect to one of the memory devices via a signal line, the signal line being different from the common line, and configured to output a chip enable signal as one of the memory input signals to the signal, line; and
a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals, wherein the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

6. The memory system of claim 5, wherein the plurality of terminals are disposed in a peripheral area of the semiconductor device.

7. The memory system of claim 5, wherein each of the second interface and the third interface is electrically connected to at least one of the plurality of terminals.

8. The memory system of claim 5, wherein at least one of the plurality of terminals form a part of the common line.

9. A semiconductor device comprising:
a processing unit; and
a memory controller configured to communicate with at least two different types of memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line, and
a third interface configured to electrically connect to one of the memory devices via a signal line, the signal line being different from the common line, and configured to output a chip enable signal as one of the memory input signals to the signal line, wherein the semiconductor device is configured to couple with any one of the memory devices in a stacking form, and the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

10. The semiconductor device of claim 9, wherein the semiconductor device is configured to couple with any one of the memory devices in the stacking form at a peripheral area of the semiconductor device.

11. A memory system comprising:
at least two different types of memory devices; and
a semiconductor device including:
a processing, and
a memory controller configured to communicate with at least two different types of memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line, and
a third interface configured to electrically connect to one of the memory devices via a signal line, the signal line being different from the common line, and configured to output a chip enable signal as one of the memory input signals to the signal line, wherein the semiconductor device is configured to couple with any one of the memory devices in a stacking form, and the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

12. The memory system of claim 11, wherein the semiconductor device is configured to couple with any one of the memory devices in the stacking form at a peripheral area of the semiconductor device.

13. A semiconductor device comprising:

a surface;

a plurality of interconnectors aligned in a peripheral area of the surface;

a processing unit inside of the semiconductor device; and a memory controller configured to be inside of the semiconductor device and to communicate with at least two different types of memory devices outside of the semiconductor device, the memory controller comprising:

a first interface configured to receive control output signals from the processing unit to access at least one of the memory devices, a conversion unit configured to covert the control output signals to memory input signals according to operation specifications of the memory devices, a second interface configured to connect to the memory devices via a common line, the common line being shared by the memory devices, and configured to output a write enable signal as one of the memory input signals through the common line, and a third interface configured to connect to one of the memory devices via a signal line, the signal line being different from the common line, and configured to output a chip enable signal as one of the memory input signals through the signal line, wherein a part of the interconnectors is configured to be corresponding to the second interface and the third interface, and the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

14. The semiconductor device of claim 13, wherein each of the second interface and the third interface is electrically connected to at least one of the plurality of interconnectors.

15. The semiconductor device of claim 13, wherein at least one of the plurality of interconnectors form a part of the common line.

16. A memory system comprising at least two different types of memory devices and a semiconductor device including:

a surface;

a plurality of interconnectors aligned in a peripheral area of the surface;

a processing unit inside of the semiconductor device; and a memory controller configured to be inside of the semiconductor device and to communicate with at least two different types of memory devices outside of the semiconductor device, the memory controller comprising:

a first interface configured to receive control output signals from the processing unit to access at least one of the memory devices, a conversion unit configured to covert the control output signals to memory input signals according to operation specifications of the memory devices, a second interface configured to connect to the memory devices via a common line, the common line being shared by the memory devices, and configured to output a write enable signal as one of the memory input signals through the common line, and a third interface configured to connect to one of the memory devices via a signal line, the signal line being different from the common line, and configured to output a chip enable signal as one of the memory input signals through the signal line, wherein a part of the interconnectors is configured to be corresponding to the second interface and the third interface, and the conversion circuit is configured to output one of the memory input signals to the one of the memory devices according to one of the operation specifications of the one of the memory devices during a period from a time when the conversion circuit outputs another one of the memory input signals to another one of the memory devices to a time when the conversion circuit receives a memory output signal corresponding to the another one of the memory input signals from the another one of the memory devices.

17. The semiconductor device of claim 16, wherein each of the second interface and the third interface is electrically connected to at least one of the plurality of interconnectors.

18. The semiconductor device of claim 16, wherein at least one of the plurality of interconnectors form a part of the common line.

19. A semiconductor device comprising:

a processing unit;

a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, and a third interface configured to connect to one of the memory devices via a signal line, the signal line being different from the common line, and configured to output a chip enable signal as one of the memory input signals to the signal line; and a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals, wherein the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

20. The semiconductor device of claim 19,
wherein the plurality of terminals are disposed in a peripheral area of the semiconductor device.

21. The semiconductor device of claim 19,
wherein each of the second interface and the third interface is electrically connected to one or more of the plurality of terminals.

22. The semiconductor device of claim 19,
wherein at least one of the plurality of terminals form a part of the common line.

23. A semiconductor device comprising:
a processing unit;
a memory controller configured to communicate with at least two different types of memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line,
a third interface configured to connect to one of the memory devices via a signal line, the signal line being different from the common line, and configured to output a chip enable signal as one of the memory input signals to the signal line, and
a signal holding circuit configured to hold memory output signals; and
a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals,
wherein the memory controller is configured to receive the memory output signals from the one of the memory devices, and
the conversion circuit instructs the signal holding circuit to temporarily hold the memory output signals when the processing unit is busy and instructs the signal holding circuit to output the memory output signals held in the signal holding circuit to the processing unit when the processing unit is ready.

24. The semiconductor device of claim 23,
wherein, when the processing unit is ready and the memory controller receives the memory output signals from the one of the memory devices, the conversion circuit instructs without holding the received memory output signals the signal holding circuit to output the received memory output signals to the processing unit.

25. The semiconductor device of claim 21,
wherein the plurality of terminals are disposed in a peripheral area of the semiconductor device.

26. The semiconductor device of claim 23,
wherein each of the second interface and the third interface is electrically connected to one or more of the plurality of terminals.

27. The semiconductor device of claim 23,
wherein at least one of the plurality of terminals form a part of the common line.

28. A semiconductor device comprising:
a processing unit;
a memory controller configured to communicate with at least two different types of memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line,
a third interface configured to connect to one of the memory devices via a signal line, the signal line being different from the common line, and configured to output a chip enable signal as one of the memory input signals to the signal line,
an arbiter circuit configured to output an instruction signal which indicates that requests of accesses to the one of the memory devices and another one of the memory devices are overlapped, and
a signal holding circuit configured to hold at least one of the memory input signals in response to the instruction signal; and
a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals.

29. The semiconductor device of claim 28,
wherein the memory controller is configured to receive memory output signals from the one of the memory devices, and
the conversion circuit instructs the signal holding circuit to temporarily hold the memory output signals when the processing unit is busy and instructs the signal holding circuit to output the memory output signals held in the signal holding circuit to the processing unit when the processing unit is ready.

30. The semiconductor device of claim 28, wherein the plurality of terminals are disposed in a peripheral area of the semiconductor device.

31. The semiconductor device of claim 28, wherein each of the second interface and the third interface is electrically connected to one or more of the plurality of terminals.

32. The semiconductor device of claim 28, wherein at least one of the plurality of terminals form a part of the common line.

33. A memory system comprising
at least two different types of memory devices and
a semiconductor device including:
a processing unit;
a memory controller configured to communicate with the memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line, and
a third interface configured to connect to one of the memory devices via a signal line, the signal line being different from the common line, and configured to output a chip enable signal as one of the memory input signals to the signal line; and
a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals,
wherein the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

34. The memory system of claim 33, wherein the plurality of terminals are disposed in a peripheral area of the semiconductor device.

35. The memory system of claim 33, wherein each of the second interface and the third interface is electrically connected to at least one of the plurality of terminals.

36. The memory system of claim 33, wherein at least one of the plurality of terminals form a part of the common line.

37. A memory system comprising
at least two different types of memory devices and
a semiconductor device including:
a processing unit;
a memory controller configured to communicate with the memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line,
a third interface configured to connect to one of the memory devices via a signal line, the signal line being different from the common line, and configured to output a chip enable signal as one of the memory input signals to the signal line, and
a signal holding circuit configured to hold memory output signals; and
a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals,
wherein the memory controller is configured to receive the memory output signals from the one of the memory devices, and
the conversion circuit instructs the signal holding circuit to temporarily hold the memory output signals when the processing unit is busy and instructs the signal holding circuit to output the memory output signals held in the signal holding circuit to the processing unit when the processing unit is ready.

38. The memory system of claim 37, wherein, when the processing unit is ready and the memory controller receives the memory output signals from the one of the memory devices, the conversion circuit instructs without holding the received memory output signals the signal holding circuit to output the received memory output signals to the processing unit.

39. The memory system of claim 37, wherein the plurality of terminals are disposed in a peripheral area of the semiconductor device.

40. The memory system of claim 37, wherein each of the second interface and the third interface is electrically connected to at least one of the plurality of terminals.

41. The memory system of claim 37, wherein at least one of the plurality of terminals form a part of the common line.

42. A memory system comprising
at least two different types of memory devices and
a semiconductor device including:
a processing unit;
a memory controller configured to communicate with the memory devices, the memory controller including:
a first interface configured to receive control output signals from the processing unit to access at least one of the memory devices,
a conversion circuit configured to covert the control output signals to memory input signals in accordance with operation specifications of the memory devices,
a second interface configured to connect to the memory devices via a common line, the common line being shared by the memory devices, and configured to output a write enable signal as one of the memory input signals to the common line, a third interface configured to connect to one of the memory devices via a signal line, the signal line being different from the common line, and configured to output a chip enable signal as one of the memory input signals to the signal line, an arbiter circuit configured to output an instruction signal which indicates that requests of accesses to the one of the memory devices and another one of the memory devices are overlapped, and a signal holding circuit configured to hold at least one of the memory input signals in response to the instruction signal; and a plurality of terminals configured to couple the semiconductor device with any one of the memory devices so that the semiconductor device and the any one of the memory devices are stacked through the plurality of terminals, the semiconductor device being configured to electrically connect to the any one of the memory devices through the plurality of terminals.

43. The memory system of claim 42, wherein the memory controller is configured to receive memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

44. The memory system of claim 42, wherein the plurality of terminals are disposed in a peripheral area of the semiconductor device.

45. The memory system of claim 42, wherein each of the second interface and the third interface is electrically connected to at least one of the plurality of terminals.

46. The memory system of claim 42, wherein at least one of the plurality of terminals form a part of the common line.

47. A semiconductor device comprising:

a processing unit; and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, and a third interface configured to electrically connect to one of the memory devices via a signal line, the signal line being different from the common line, and configured to output a chip enable signal as one of the memory input signals to the signal line, wherein the semiconductor device is configured to couple with any one of the memory devices in a stacking form, and the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

48. The semiconductor device of claim 47, wherein the semiconductor device is configured to couple with any one of the memory devices in the stacking form at a peripheral area of the semiconductor device.

49. A semiconductor device comprising:

a processing unit; and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, a third interface configured to electrically connect to one of the memory devices via a signal line, the signal line being different from the common line, and configured to output a chip enable signal as one of the memory input signals to the signal line, and a signal holding circuit configured to hold memory output signals, wherein the semiconductor device is configured to couple with any one of the memory devices in a stacking form, the memory controller is configured to receive the memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

50. The semiconductor device of claim 49, wherein, when the processing unit is ready and the memory controller receives the memory output signals from the one of the memory devices, the conversion circuit instructs without holding the received memory output signals the signal holding circuit to output the received memory output signals to the processing unit.

51. The semiconductor device of claim 49, wherein the semiconductor device is configured to couple with any one of the memory devices in the stacking form at a peripheral area of the semiconductor device.

52. A semiconductor device comprising:

a processing unit; and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, a third interface configured to electrically connect to one of the memory devices via a signal line, the signal line being different from the common line, and configured to output a chip enable signal as one of the memory input signals to the signal line, an arbiter circuit configured to output an instruction signal which indicates that requests of accesses to the one of the memory devices and another one of the memory devices are overlapped, and a signal holding circuit configured to hold at least one of the memory input signals in response to the instruction signal, wherein the semiconductor device is configured to couple with any one of the memory devices in a stacking form.

53. The semiconductor device of claim 52, wherein the memory controller is configured to receive memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

54. The semiconductor device of claim 52, wherein the semiconductor device is configured to couple with any one of the memory devices in the stacking form at a peripheral area of the semiconductor device.

55. A memory system comprising:

at least two different types of memory devices; and a semiconductor device including a processing unit and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, and a third interface configured to electrically connect to one of the memory devices via a signal line, the signal line being different from the common line, and configured to output a chip enable signal as one of the memory input signals to the signal line, wherein the semiconductor device is configured to couple with any one of the memory devices in a stacking form, and the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

56. The memory system of claim 55, wherein the semiconductor device is configured to couple with any one of the memory devices in the stacking form at a peripheral area of the semiconductor device.

57. A memory system comprising:

at least two different types of memory devices; and a semiconductor device including a processing unit and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, a third interface configured to electrically connect to one of the memory devices via a signal line, the signal line being different from the common line, and configured to output a chip enable signal as one of the memory input signals to the signal line, and a signal holding circuit configured to hold memory output signals, wherein the semiconductor device is configured to couple with any one of the memory devices in a stacking form, the memory controller is configured to receive the memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

58. The memory system of claim 57, wherein, when the processing unit is ready and the memory controller receives the memory output signals from the one of the memory devices, the conversion circuit instructs without holding the received memory output signals the signal holding circuit to output the received memory output signals to the processing unit.

59. The memory system of claim 57, wherein the semiconductor device is configured to couple with any one of the memory devices in the stacking form at a peripheral area of the semiconductor device.

60. A memory system comprising:

at least two different types of memory devices; and a semiconductor device including a processing unit and a memory controller configured to communicate with at least two different types of memory devices, the memory controller including:

a first interface configured to receive control output signals from the processing unit to access at least one of the memory devices, a conversion circuit configured to covert the control output signals to memory input signals in accordance with operation specifications of the memory devices, a second interface configured to connect to the memory devices via a common line, the common line being shared by the memory devices, and configured to output a write enable signal as one of the memory input signals to the common line, a third interface configured to electrically connect to one of the memory devices via a signal line, the signal line being different from the common line, and configured to output a chip enable signal as one of the memory input signals to the signal line, an arbiter circuit configured to output an instruction signal which indicates that requests of accesses to the one of the memory devices and another one of the memory devices are overlapped, and a signal holding circuit configured to hold at least one of the memory input signals in response to the instruction signal, wherein the semiconductor device is configured to couple with any one of the memory devices in a stacking form.

61. The memory system of claim 60, wherein the memory controller is configured to receive memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

62. The memory system of claim 60, wherein the semiconductor device is configured to couple with any one of the memory devices in the stacking form at a peripheral area of the semiconductor device.

63. A semiconductor device comprising:

a surface;

a plurality of interconnectors aligned in a peripheral area of the surface;

a processing unit inside of the semiconductor device; and a memory controller configured to be inside of the semiconductor device and to communicate with at least two different types of memory devices outside of the semiconductor device, the memory controller comprising:

a first interface configured to receive control output signals from the processing unit to access at least one of the memory devices, a conversion unit configured to covert the control output signals to memory input signals according to operation specifications of the memory devices, a second interface configured to connect to the memory devices via a common line, the common line being shared by the memory devices, and configured to output a write enable signal as one of the memory input signals through the common line, and a third interface configured to connect to one of the memory devices via a signal line, the signal line being different from the common line, and configured to output a chip enable signal as one of the memory input signals through the signal line, wherein a part of the interconnectors is configured to be corresponding to the second interface and the third interface, and the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

64. The semiconductor device of claim 63, wherein each of the second interface and the third interface is electrically connected to at least one of the plurality of interconnectors.

65. The semiconductor device of claim 63, wherein at least one of the plurality of interconnectors form a part of the common line.

66. A semiconductor device comprising:

a surface;

a plurality of interconnectors aligned in a peripheral area of the surface;

a processing unit inside of the semiconductor device; and a memory controller configured to be inside of the semiconductor device and to communicate with at least two different types of memory devices outside of the semiconductor device, the memory controller comprising:

a first interface configured to receive control output signals from the processing unit to access at least one of the memory devices, a conversion unit configured to covert the control output signals to memory input signals according to operation specifications of the memory devices, a second interface configured to connect to the memory devices via a common line, the common line being shared by the memory devices, and configured to output a write enable signal as one of the memory input signals through the common line, a third interface configured to connect to one of the memory devices via a signal line, the signal line being different from the common line, and configured to output a chip enable signal as one of the memory input signals through the signal line, and a signal holding circuit configured to hold memory output signals, wherein a part of the interconnectors is configured to be corresponding to the second interface and the third interface, the memory controller is configured to receive the memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

67. The semiconductor device of claim 66, wherein, when the processing unit is ready and the memory controller receives the memory output signals from the one of the memory devices, the conversion circuit instructs without holding the received memory output signals the signal holding circuit to output the received memory output signals to the processing unit.

68. The semiconductor device of claim 66,
wherein each of the second interface and the third interface is electrically connected to at least one of the plurality of interconnectors.

69. The semiconductor device of claim 66,
wherein at least one of the plurality of interconnectors form a part of the common line.

70. A semiconductor device comprising:
a surface;
a plurality of interconnectors aligned in a peripheral area of the surface;
a processing unit inside of the semiconductor device; and
a memory controller configured to be inside of the semiconductor device and to communicate with at least two different types of memory devices outside of the semiconductor device, the memory controller comprising:
a first interface configured to receive control output signals from the processing unit to access at least one of the memory devices,
a conversion unit configured to covert the control output signals to memory input signals according to operation specifications of the memory devices,
a second interface configured to connect to the memory devices via a common line, the common line being shared by the memory devices, and configured to output a write enable signal as one of the memory input signals through the common line,
a third interface configured to connect to one of the memory devices via a signal line, the signal line being different from the common line, and configured to output a chip enable signal as one of the memory input signals through the signal line,
an arbiter circuit configured to output an instruction signal which indicates that requests of accesses to the one of the memory devices and another one of the memory devices are overlapped, and
a signal holding circuit configured to hold at least one of the memory input signals in response to the instruction signal,
wherein a part of the interconnectors is configured to be corresponding to the second interface and the third interface.

71. The semiconductor device of claim 70,
wherein the memory controller is configured to receive memory output signals from the one of the memory devices, and
the conversion circuit instructs the signal holding circuit to temporarily hold the memory output signals when the processing unit is busy and instructs the signal holding circuit to output the memory output signals held in the signal holding circuit to the processing unit when the processing unit is ready.

72. The semiconductor device of claim 70,
wherein each of the second interface and the third interface is electrically connected to at least one of the plurality of interconnectors.

73. The semiconductor device of claim 70,
wherein at least one of the plurality of interconnectors form a part of the common line.

74. A memory system comprising
at least two different types of memory devices and
a semiconductor device including:
a surface;
a plurality of interconnectors aligned in a peripheral area of the surface;
a processing unit inside of the semiconductor device; and
a memory controller configured to be inside of the semiconductor device and to communicate with at least two different types of memory devices outside of the semiconductor device, the memory controller comprising:
a first interface configured to receive control output signals from the processing unit to access at least one of the memory devices,
a conversion unit configured to covert the control output signals to memory input signals according to operation specifications of the memory devices,
a second interface configured to connect to the memory devices via a common line, the common line being shared by the memory devices, and configured to output a write enable signal as one of the memory input signals through the common line, and
a third interface configured to connect to one of the memory devices via a signal line, the signal line being different from the common line, and configured to output a chip enable signal as one of the memory input signals through the signal line,
wherein a part of the interconnectors is configured to be corresponding to the second interface and the third interface, and
the conversion circuit is configured to output one of the memory input signals to the one of the memory devices according to one of the operation specifications of the one of the memory devices and to receive a memory output signal corresponding to the one of the memory input signals from the one of the memory devices during a period from a time when the conversion circuit outputs another one of the memory input signals to another one of the memory devices to a time when the conversion circuit receives a memory output signal corresponding to the another one of the memory input signals from the another one of the memory devices.

75. The semiconductor device of claim 74,
wherein each of the second interface and the third interface is electrically connected to at least one of the plurality of interconnectors.

76. The semiconductor device of claim 74,
wherein at least one of the plurality of interconnectors form a part of the common line.

77. A memory system comprising
at least two different types of memory devices and
a semiconductor device including:
a surface;
a plurality of interconnectors aligned in a peripheral area of the surface;
a processing unit inside of the semiconductor device; and
a memory controller configured to be inside of the semiconductor device and to communicate with at least two different types of memory devices outside of the semiconductor device, the memory controller comprising:
a first interface configured to receive control output signals from the processing unit to access at least one of the memory devices,
a conversion unit configured to covert the control output signals to memory input signals according to operation specifications of the memory devices,
a second interface configured to connect to the memory devices via a common line, the common line being shared by the memory devices, and configured to output a write enable signal as one of the memory input signals through the common line,
a third interface configured to connect to one of the memory devices via a signal line, the signal line being different from the common line, and configured to output a chip enable signal as one of the memory input signals through the signal line, and a signal holding circuit configured to hold memory output signals, wherein a part of the interconnectors is configured to be corresponding to the second interface and the third interface, the memory controller is configured to receive the memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

78. The semiconductor device of claim 77, wherein, when the processing unit is ready and the memory controller receives the memory output signals from the one of the memory devices, the conversion circuit instructs without holding the received memory output signals the signal holding circuit to output the received memory output signals to the processing unit.

79. The semiconductor device of claim 77, wherein each of the second interface and the third interface is electrically connected to at least one of the plurality of interconnectors.

80. The semiconductor device of claim 77, wherein at least one of the plurality of interconnectors form a part of the common line.

81. A memory system comprising at least two different types of memory devices and a semiconductor device including:

a surface;

a plurality of interconnectors aligned in a peripheral area of the surface;

a processing unit inside of the semiconductor device; and a memory controller configured to be inside of the semiconductor device and to communicate with at least two different types of memory devices outside of the semiconductor device, the memory controller comprising:

a first interface configured to receive control output signals from the processing unit to access at least one of the memory devices, a conversion unit configured to covert the control output signals to memory input signals according to operation specifications of the memory devices, a second interface configured to connect to the memory devices via a common line, the common line being shared by the memory devices, and configured to output a write enable signal as one of the memory input signals through the common line, a third interface configured to connect to one of the memory devices via a signal line, the signal line being different from the common line, and configured to output a chip enable signal as one of the memory input signals through the signal line, an arbiter circuit configured to output an instruction signal which indicates that requests of accesses to the one of the memory devices and another one of the memory devices are overlapped, and a signal holding circuit configured to hold at least one of the memory input signals in response to the instruction signal, wherein a part of the interconnectors is configured to be corresponding to the second interface and the third interface.

82. The semiconductor device of claim 81, wherein the memory controller is configured to receive memory output signals from the one of the memory devices, and the conversion circuit instructs the signal holding circuit to temporarily hold the memory output signals when the processing unit is busy and instructs the signal holding circuit to output the memory output signals held in the signal holding circuit to the processing unit when the processing unit is ready.

83. The semiconductor device of claim 81, wherein each of the second interface and the third interface is electrically connected to at least one of the plurality of interconnectors.

84. The semiconductor device of claim 81, wherein at least one of the plurality of interconnectors form a part of the common line.

\* \* \* \* \*